US012782423B2

(12) United States Patent
Tamura

(10) Patent No.: US 12,782,423 B2
(45) Date of Patent: Nov. 3, 2026

(54) PROBER AND TEMPERATURE MEASUREMENT METHOD

(71) Applicant: Tokyo Seimitsu Co., Ltd., Hachioji-city (JP)

(72) Inventor: Hiroo Tamura, Hachioji-city (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 325 days.

(21) Appl. No.: 18/589,423

(22) Filed: Feb. 28, 2024

(65) Prior Publication Data

US 2024/0329118 A1 Oct. 3, 2024

(30) Foreign Application Priority Data

Mar. 31, 2023 (JP) ................................ 2023-059126

(51) Int. Cl.

| | |
|---|---|
| ***G01R 31/28*** | (2006.01) |
| ***G01R 1/04*** | (2006.01) |
| ***G01R 1/067*** | (2006.01) |
| ***G01R 1/073*** | (2006.01) |
| ***G01R 31/26*** | (2020.01) |
| ***H10P 72/72*** | (2026.01) |
| ***H10P 74/20*** | (2026.01) |

(52) U.S. Cl.

CPC ..... *G01R 31/2874* (2013.01); *G01R 1/07342* (2013.01); *H10P 72/72* (2026.01); *H10P 74/207* (2026.01)

(58) Field of Classification Search

CPC .......... G01R 31/26; G01R 31/28; G01R 1/04; G01R 1/067; G01R 1/073

See application file for complete search history.

(56) References Cited

U.S. PATENT DOCUMENTS

2020/0209072 A1* 7/2020 Yamasaki .............. G01K 13/00
2024/0402021 A1* 12/2024 Ota .................... G01R 31/2601

FOREIGN PATENT DOCUMENTS

JP 2019-50389 A 3/2019

* cited by examiner

*Primary Examiner* — Neel D Shah

(74) *Attorney, Agent, or Firm* — Yokoi & Co., U.S.A.; Toshiyuki Yokoi

(57) ABSTRACT

Provided with a prober and a temperature measurement method capable of achieving an automatization of a temperature measurement of a wafer chuck. A temperature measurement jig (70) having one or more temperature sensors (72) is supported at a position where a probe card is supported when the probe card is conveyed using a conveyance device configured to transfer the probe card to a wafer chuck (18), the temperature measurement jig having one or more temperature sensors, and the one or more temperature sensors is contacted with a surface of the wafer chuck to be measured in a state that the conveyance device supports the temperature measurement jig.

6 Claims, 20 Drawing Sheets

PROBER AND TEMPERATURE MEASUREMENT METHOD

CROSS-REFERENCE TO RELATED APPLICATIONS

This patent specification is based on Japanese patent application, No. 2023-059126 filed on Mar. 31, 2023 in the Japan Patent Office, the entire contents of which are incorporated by reference herein.

PRIOR ART

[Patent Document 1] Japanese Unexamined Patent Application Publication No. 2019-50389

BACKGROUND OF THE INVENTION

The present disclosure relates to a prober and a temperature measurement method applied to an inspection of electric characteristics of semiconductor chips formed on a wafer.

A temperature calibration is performed in the prober when delivering a device and when performing a periodical maintenance of the device. In the temperature calibration, an operator mounts a temperature measurement jig on a head stage in each temperature range applied to the measurement to perform a temperature measurement. In the temperature measurement, the operator acquires the measurement data, operates a computer for executing a macro to create a correction table, and installs the created correction table to the device. After the correction table is installed to the device, the operator checks whether or not the temperature control is performed using the correct value.

Patent Document 1 discloses a prober for performing a temperature measurement of a wafer chuck using a probe card-type temperature sensor which is replaced with a probe card. When mounting the probe card-type temperature sensor described in Patent Document 1 on a test head, a pogo frame attached to the test head for the probe card is replaced with a pogo frame for exclusive use and the probe card-type temperature sensor is supported on the test head by using the pogo frame for exclusive use.

SUMMARY OF THE INVENTION

However, in the conventional way, the operator enters inside a loader and opens a center shutter of the head stage on which the wafer chuck, which is the object of the temperature measurement, is arranged, and mounts the temperature measurement jig in each temperature range. In the above described way, when the measurement temperature is low (e.g., minus 40° C.), there is a possibility of condensation. When the measurement temperature is high (e.g., 120° C.), there is a risk of burn injury of the operator. Furthermore, when the working time is long, the influence to the internal temperature of the head stage is worried.

In addition, the temperature measurement is performed in each temperature range. Thus, when the temperature setting is changed, the measurement in the set temperature range is performed after the temperature is stabilized. Therefore, a waiting time is required before the temperature is stabilized. The waiting time may be several hours in some cases. Furthermore, since the acquisition of the measurement data, the installation of correction table and the like are performed by the operator, the man hours increase enormously.

In the prober described in Patent Document 1, the process of replacing the pogo frame is performed separately from the process of mounting the probe card-type temperature sensor on the test head. Thus, the increment of the man hours and the working time is worried.

The present disclosure solves at least one of the problems of the above described prior arts. Specifically, the present disclosure provides a prober and a temperature measurement method capable of achieving the automatization of the temperature measurement of the wafer chuck.

One aspect of the prober of the present disclosure is a prober for performing an electric test of a wafer, the prober including: a wafer chuck configured to support the wafer; a conveyance device configured to transfer a probe card to the wafer chuck; and a conveyance controller configured to control an operation of the conveyance device, wherein the conveyance device is configured to support a temperature measurement jig when a temperature measurement of the wafer chuck is performed, the temperature measurement jig being able to be supported at a position where the probe card is supported when the probe card is conveyed, the temperature measurement jig having one or more temperature sensors, and the conveyance controller performs an operation control of the conveyance device for making the one or more temperature sensors contact a surface of the wafer chuck to be measured in a state that the conveyance device supports the temperature measurement jig.

One aspect of the temperature measurement method of the present disclosure is a temperature measurement method for measuring a temperature of a wafer chuck which is configured to support a wafer in a prober for performing an electric test of the wafer, the method including the steps of: conveying a temperature measurement jig using a conveyance device configured to transfer a probe card to the wafer chuck, the temperature measurement jig being able to be supported at a position where the probe card is supported when the probe card is conveyed, the temperature measurement jig having one or more temperature sensors; and making the one or more temperature sensors contact a surface of the wafer chuck to be measured in a state that the conveyance device supports the temperature measurement jig.

One aspect of the prober of the present disclosure is a prober for performing an electric test of a wafer, the prober including: a wafer chuck configured to support the wafer; an alignment device configured to adjust a position of the wafer chuck; an alignment controller configured to control an operation of the alignment device; and a head stage to which a probe card is attached when the electric test is performed, wherein a temperature measurement jig is configured to be attached to the head stage when a temperature measurement of the wafer chuck is performed, the temperature measurement jig being able to be attached to the head stage at a position where the probe card is attached when the electric test is performed, the temperature measurement jig having one or more temperature sensors, and the alignment controller is configured to control the operation of the alignment device for making the one or more temperature sensors contact a surface of the wafer chuck to be measured.

One aspect of the temperature measurement method of the present disclosure is a temperature measurement method for measuring a temperature of a wafer chuck which is configured to support a wafer in a prober for performing an electric test of the wafer, the method including the steps of: attaching a temperature measurement jig to the head stage at a position where a probe card is attached when the electric test is performed, the temperature measurement jig having one or more more temperature sensors, and making the one or more temperature sensors contact a surface of the wafer chuck to be measured.

In the present disclosure, the temperature measurement is performed by using the temperature measurement jig which has one or more temperature sensors and is conveyed by using the conveyance device. Consequently, the automatization of the temperature measurement of the wafer chuck is achieved.

DETAILED DESCRIPTION OF THE INVENTION

Figure 1:
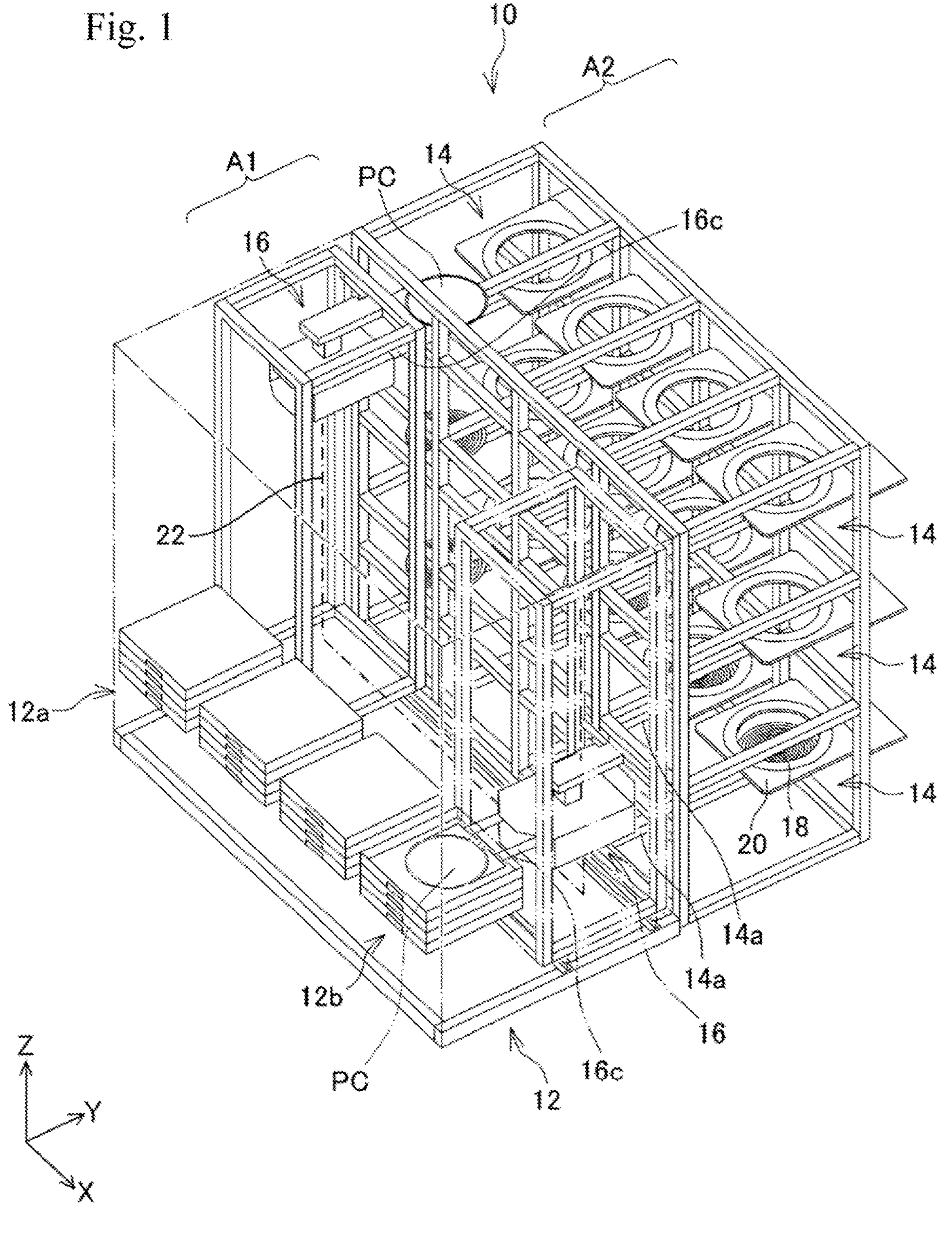
FIG. 1 is a perspective view showing a schematic configuration of the first embodiment of a prober.

The prober of the first aspect of the present disclosure is a prober for performing an electric test of a wafer, the prober including: a wafer chuck configured to support the wafer; a conveyance device configured to transfer a probe card to the wafer chuck; and a conveyance controller configured to control an operation of the conveyance device, wherein the conveyance device is configured to support a temperature measurement jig when a temperature measurement of the wafer chuck is performed, the temperature measurement jig being able to be supported at a position where the probe card is supported when the probe card is conveyed, the temperature measurement jig having one or more temperature sensors, and the conveyance controller performs an operation control of the conveyance device for making the one or more temperature sensors contact a surface of the wafer chuck to be measured in a state that the conveyance device supports the temperature measurement jig.

When the above described prober of the first aspect is used, the temperature measurement is performed by using the temperature measurement jig which has one or more temperature sensors and conveyed by using the conveyance device. Consequently, the automatization of the temperature measurement of the wafer chuck is achieved.

In the prober of the second aspect of the present disclosure, a measured data collecting device for collecting a temperature measurement data of the wafer chuck transmitted from the one or more temperature sensors is configured to be attached to the conveyance device in the prober of the first aspect.

In the above described prober, the measured data collecting device can transmit the temperature measurement data of the wafer chuck to a control device of the prober. The control device of the prober can generate a temperature calibration table applied to the temperature control of the wafer chuck based on the temperature measurement data of the wafer chuck.

In the prober of the third aspect of the present disclosure, the conveyance device is configured to support the temperature measurement jig by a tip of an arm extending outward from a main body, the measured data collecting device is configured to be electrically connected with each of the one or more temperature sensors using an electric wiring, and the electric wiring is configured to be supported by using the arm in the prober of the second aspect.

In the above described prober, the temperature measurement jig, the electric wiring and the measured data collecting device are integrally housed in the conveyance device. Consequently, the disconnection of the electric wiring is suppressed and the occurrence of connection abnormality for connecting the temperature measurement jig and the measured data collecting device with the electric wiring is suppressed.

In the prober of the fourth aspect of the present disclosure, the one or more temperature sensors include a contactor with which the surface of the wafer chuck to be measured is in surface contact in the prober of the first to third aspects.

In the above described prober, a certain degree of robustness can be ensured against external disturbance in the temperature measurement compared to the temperature sensor having a contactor which is point-contacted with the surface of the wafer chuck to be measured.

The temperature measurement method of the fifth aspect of the present disclosure is a temperature measurement method for measuring a temperature of a wafer chuck which is configured to support a wafer in a prober for performing an electric test of the wafer, the method including the steps of: conveying a temperature measurement jig using a conveyance device configured to transfer a probe card to the wafer chuck, the temperature measurement jig being able to be supported at a position where the probe card is supported when the probe card is conveyed, the temperature measurement jig having one or more temperature sensors; and making the one or more temperature sensors contact a surface of the wafer chuck to be measured in a state that the conveyance device supports the temperature measurement jig.

In the above described temperature measurement method, the operation and effect similar to the prober of the first aspect can be obtained.

Note that the above described temperature measurement method can be appropriately combined with the matter same as the matter identified in any of the second to fourth aspects of the prober. In that case, the elements for performing the processes and the functions identified in the prober can be recognized as the elements of the temperature measurement method for performing the corresponding processes and functions.

In the temperature measurement method of the sixth aspect of the present disclosure, a temperature measurement data of the wafer chuck transmitted from the one or more temperature sensors is collected in the temperature measurement method of the fifth aspect.

The prober of the seventh aspect of the present disclosure is a prober for performing an electric test of a wafer, the prober including: a wafer chuck configured to support the wafer; an alignment device configured to adjust a position of the wafer chuck; an alignment controller configured to control an operation of the alignment device; and a head stage to which a probe card is attached when the electric test is performed, wherein a temperature measurement jig is configured to be attached to the head stage when a temperature measurement of the wafer chuck is performed, the temperature measurement jig being able to be attached to the head stage at a position where the probe card is attached when the electric test is performed, the temperature measurement jig having one or more temperature sensors, and the alignment controller is configured to control the operation of the alignment device for making the one or more temperature sensors contact a surface of the wafer chuck to be measured.

In the above described prober, the operation and effect similar to the prober of the first aspect can be obtained.

In the prober of the eighth aspect of the present disclosure, a fixing member is provided for fixing the wafer chuck to the head stage in the prober of the seventh aspect.

In the above described prober, the wafer chuck is prevented from falling off from the head stage when the temperature measurement of the wafer chuck is performed.

The prober can include a fixing device for supporting the fixing member so as to be movable with respect to the head stage. The fixing device can include a guide for supporting the fixing member and a driving source of the fixing member.

In the prober of the ninth aspect of the present disclosure, a head stage moving mechanism configured to move the head stage between a temperature measurement position at which the head stage is arranged when measuring the temperature of the wafer chuck and a maintenance position at which the head stage is arranged when attaching the temperature measurement jig to the head stage in the prober of the seventh or eighth aspect.

The above described prober can include a lock mechanism for locking a position of the head stage moving mechanism.

In the prober of the tenth aspect of the present disclosure, the one or more temperature sensors include a contactor with which the surface of the wafer chuck to be measured is in surface contact in the prober of any one of seventh to ninth aspects.

In the above described prober, a certain degree of robustness can be ensured against external disturbance in the temperature measurement compared to the temperature sensor having a contactor which is point-contacted with the surface of the wafer chuck to be measured.

The temperature measurement method of the eleventh aspect of the present disclosure is a temperature measurement method for measuring a temperature of a wafer chuck which is configured to support a wafer in a prober for performing an electric test of the wafer, the method including the steps of: attaching a temperature measurement jig to the head stage at a position where a probe card is attached when the electric test is performed, the temperature measurement jig having one or more temperature sensors, and making the one or more temperature sensors contact a surface of the wafer chuck to be measured.

Note that the above described temperature measurement method can be appropriately combined with the matter same as the matter identified in any of the seventh to tenth aspects of the prober. In that case, the elements for performing the processes and the functions identified in the prober can be recognized as the elements of the temperature measurement method for performing the corresponding processes and functions.

Hereafter, the embodiments will be explained in detail in accordance with the attached drawings. In the specification, the same reference numeral is assigned to the same elements and repeated explanation is omitted appropriately.

First Embodiment of Prober

FIG. 1 shows a schematic configuration of the first embodiment of the prober. Specifically, FIG. 1 is a perspective view of a prober 10 in a state that a panel covering an outer periphery is removed and an internal structure can be seen. The prober 10 includes a conveyed article housing portion 12, a plurality of measurement chambers 14, a conveyance unit 16 and moving device 22. A conveyance area A1 is arranged between the conveyed article housing portion 12 and the plurality of measurement chambers 14. The conveyance unit 16 is arranged in the conveyance area A1. A maintenance area A2 is arranged in an opposite side of the conveyance area A1 with respect to the plurality of measurement chambers 14.

Each of X, Y and Z shown in FIG. 1 indicates each of the axes constituting a three-dimensional orthogonal coordinate system. In the explanation of the first embodiment, two axial directions perpendicular to each other defined as the surface of installing the prober 10 are an X-axis and a Y-axis and an axis perpendicular to the surface installing the prober 10 is a Z-axis. Although the above described axes may be used in the other figures, the meaning of each axis is same as the above described definition.

The plurality of measurement chambers 14 is two-dimensionally arranged in the X-axis direction and the Z-axis direction. In addition, the conveyed article housing portion 12, the conveyance area A1, the plurality of measurement chambers 14 and the maintenance area A2 are arranged along the Y-axis direction in this order.

Figure 4:
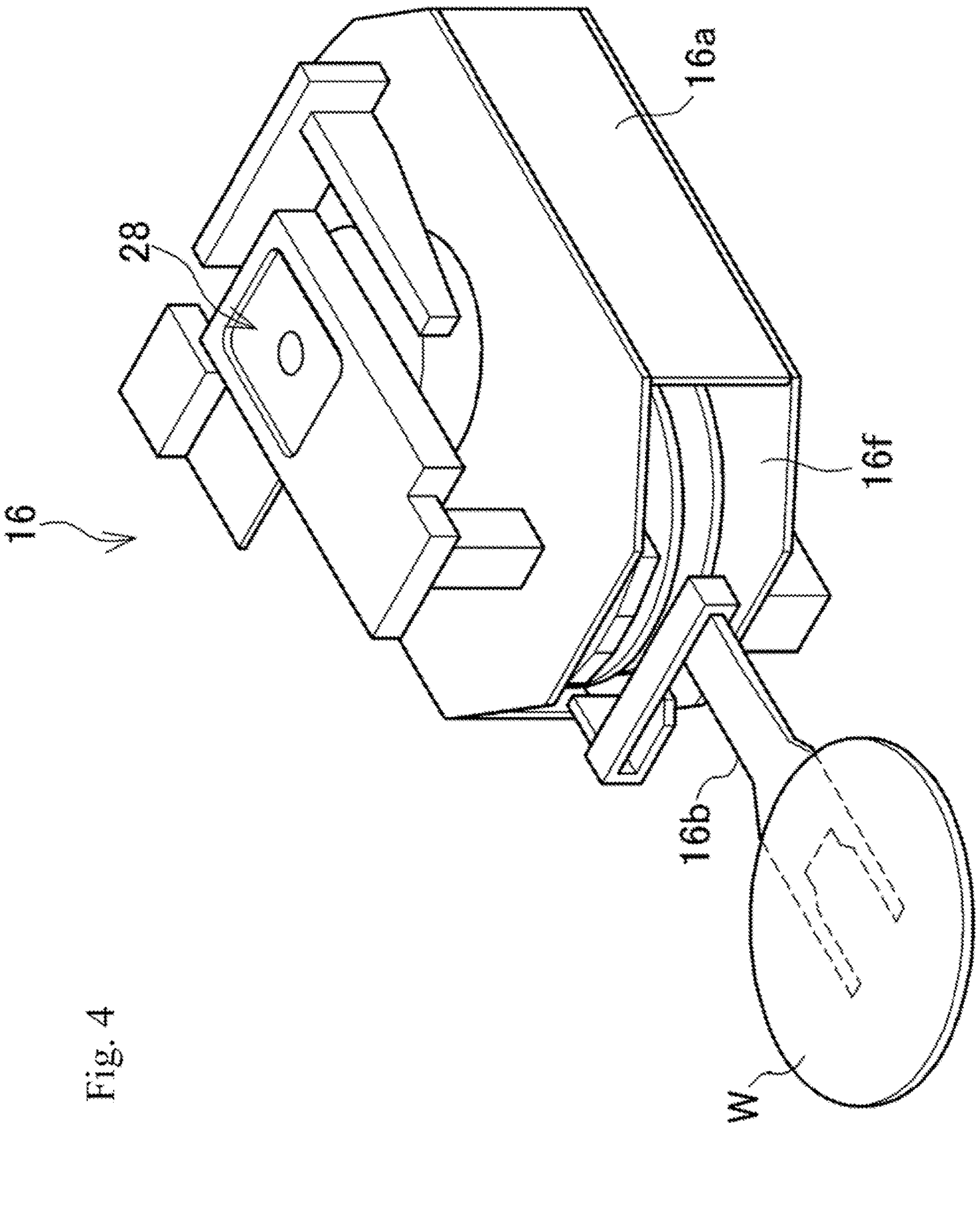
FIG. 4 is a perspective view of a conveyance unit showing a state that a wafer is mounted.

The conveyed article housing portion 12 includes a wafer housing portion 12*a* into which a plurality of wafers is housed and a probe card housing portion 12*b* into which a plurality of probe cards PC is housed. A plurality of wafer housing portions 12*a* and/or a plurality of probe card housing portions 12*b* are arranged along the X-axis in the conveyed article housing portion 12. Note that the number and the arrangement of the wafer housing portions 12*a* and the probe card housing portion 12*b* are not limited to the example shown in FIG. 1. The number and the arrangement can be appropriately specified. Note that the illustration of the wafer is omitted in FIG. 1. A wafer W is shown in FIG. 4.

The operator can access to the conveyed article housing portion 12 (physically participate in the prober 10) from one end in the Y-axis direction, while the conveyance unit 16 can access to the conveyed article housing portion 12 from the other end in the Y-axis direction. Specifically, the operator can perform the collection or the like of the wafer from the one end of the conveyed article housing portion 12 in the Y-axis direction.

Figure 2:
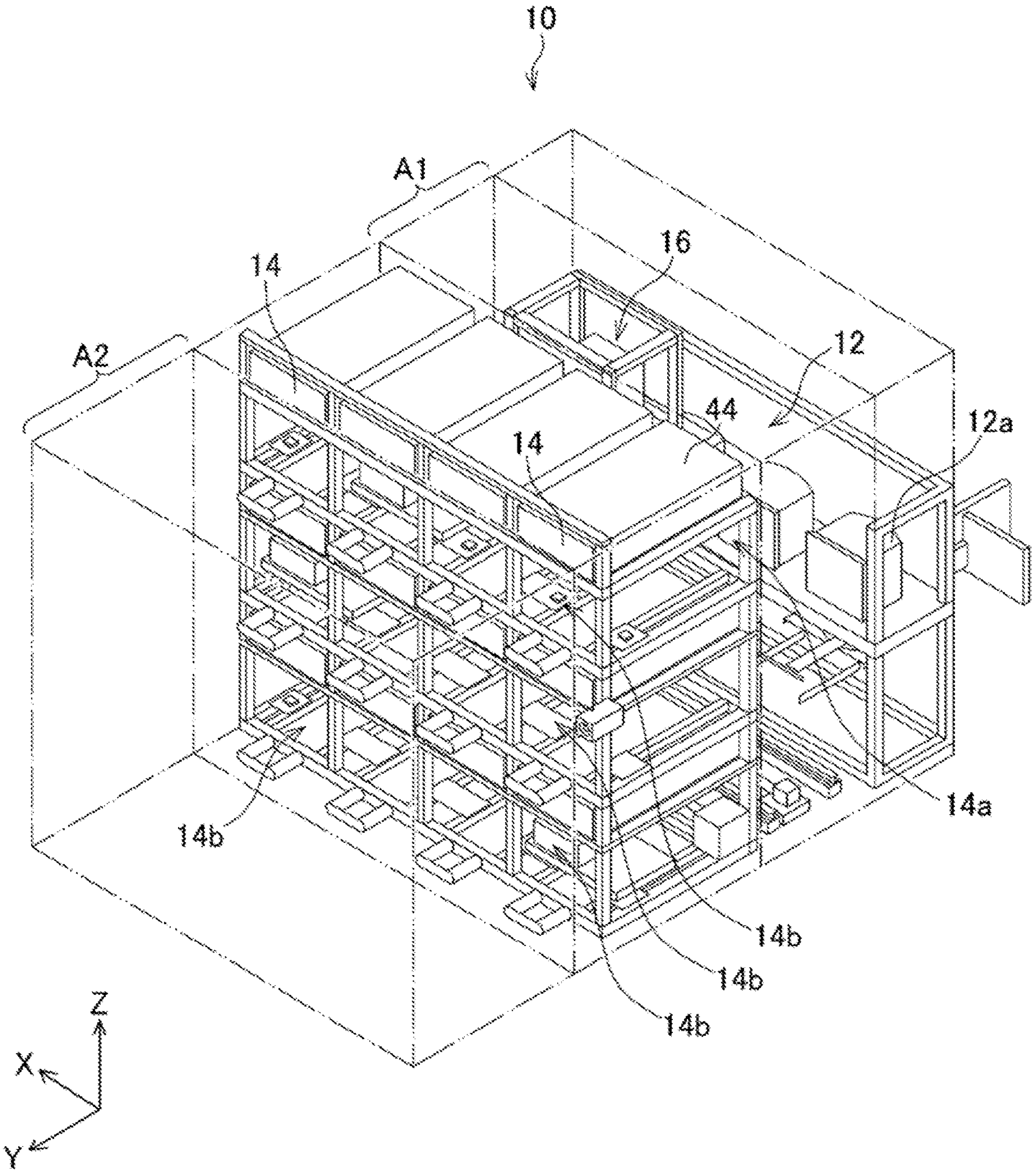
FIG. 2 is a perspective view of the first embodiment of the prober viewed from the maintenance area.

Each of the plurality of measurement chambers 14 has a rectangular parallelopiped shape partitioned by using a plurality of frames extending in the X-axis direction, a plurality of frames extending in the Y-axis direction and a plurality of frames extending in the Z-axis direction. The measurement chamber 14 having a rectangular parallelopiped shape can be referred to as a prober chamber. A wafer chuck 18, a head stage 20 and a test head are arranged inside the measurement chamber 14. Note that the illustration of the test head is omitted in FIG. 1. Note that a test head 44 is shown in FIG. 2 and the other figures.

The test head provided on the measurement chamber 14 transmits test signals to the wafer to be examined and receives the signals transmitted from the wafer.

Figure 13:
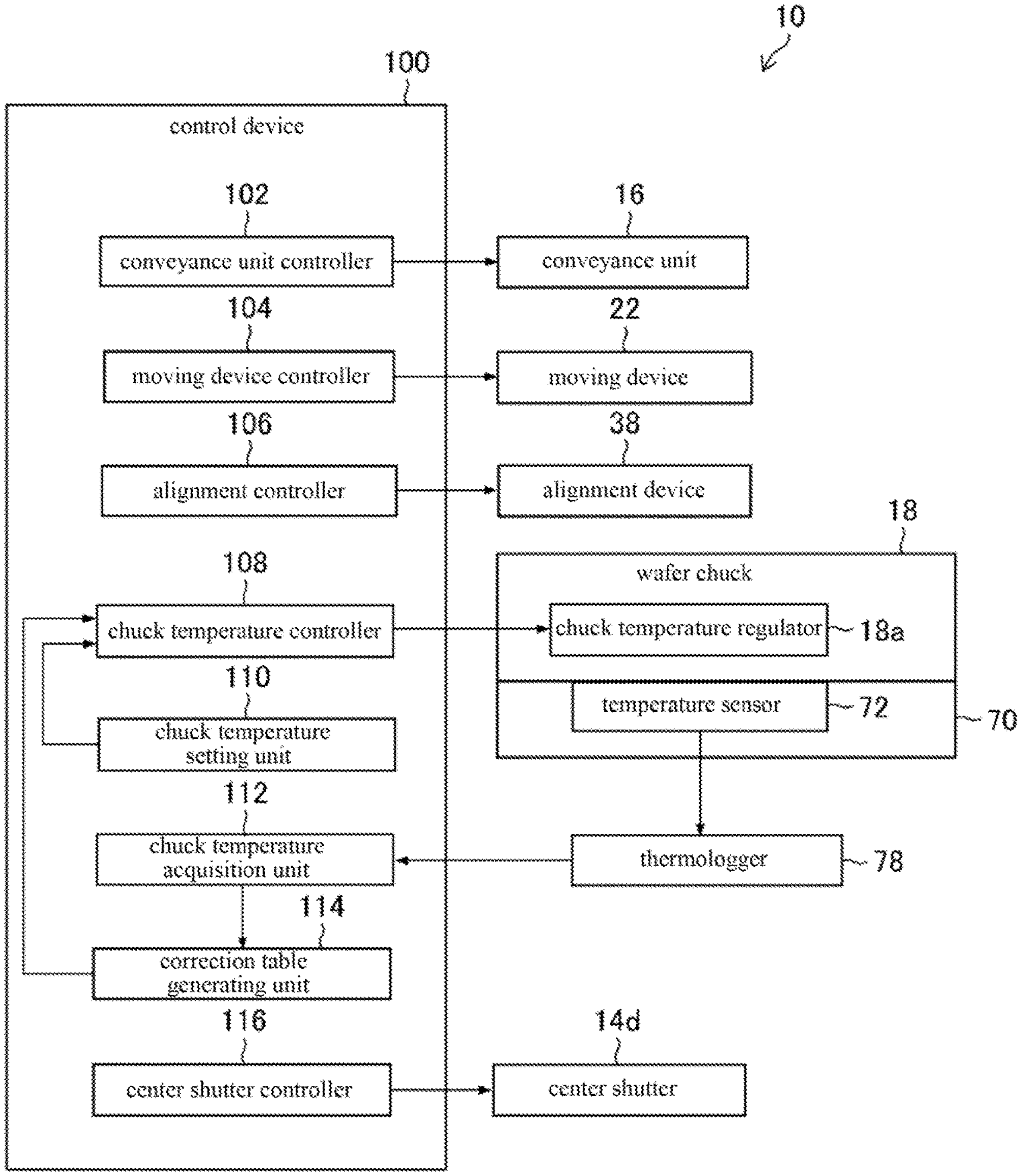
FIG. 13 is a functional block diagram showing an electrical configuration of the first embodiment of the prober.

A first opening 14*a* is formed on one end (the conveyance area A1 side) of the measurement chamber 14. The first opening 14*a* functions as an inlet/output port for entering/removing the wafer and the probe card PC conveyed by using the conveyance unit 16 into/from the measurement chamber 14. A center shutter is attached to each of the measurement chambers 14 for opening/closing the first opening 14*a*. Note that a center shutter 14*d* is shown in FIG. 13.

Figure 7:
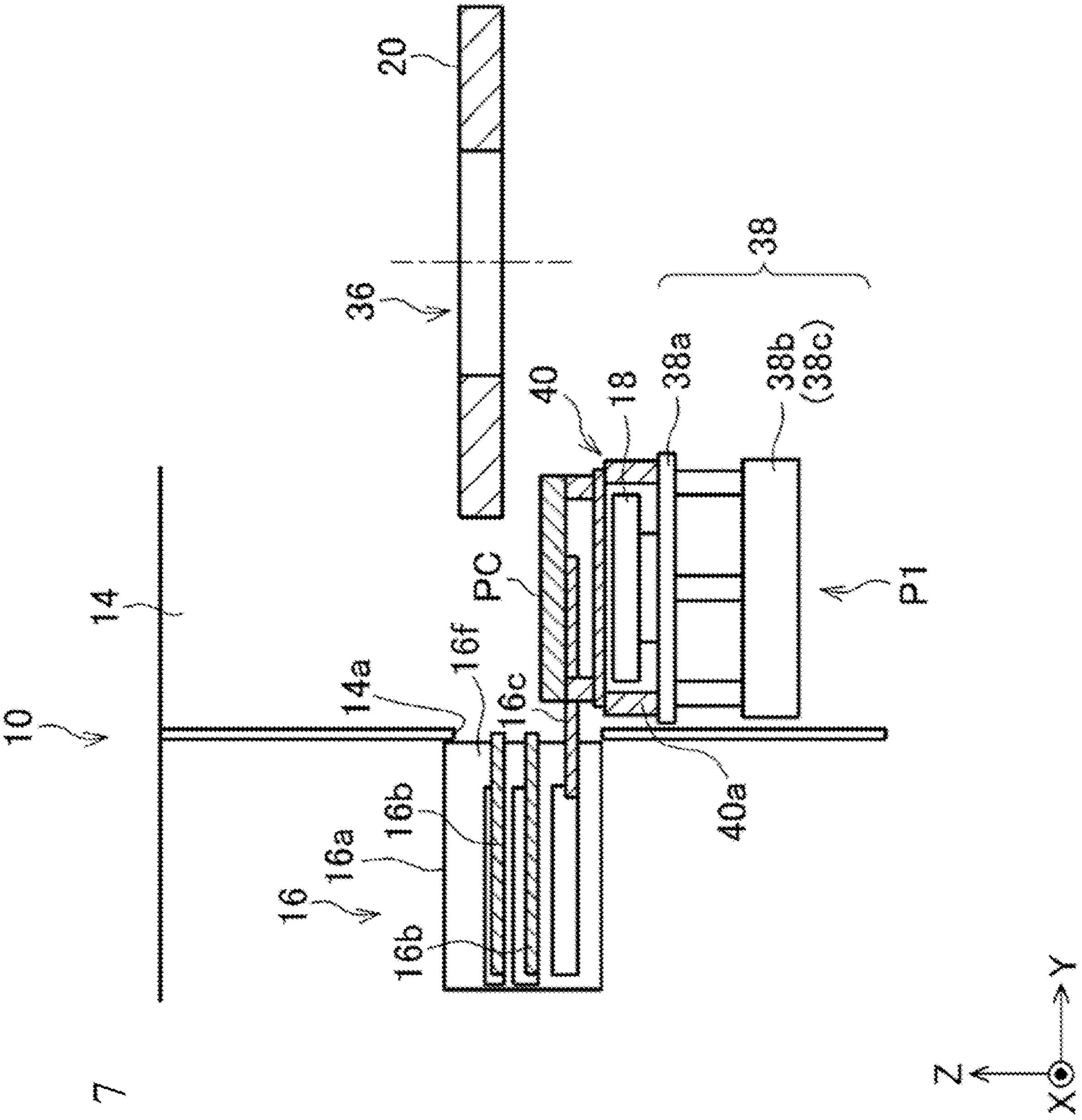
FIG. 7 is a cross-sectional view showing a use state of the conveyance unit and a schematic diagram showing a state that the probe card is conveyed.

The measurement chamber 14 includes an alignment device for aligning the position between the head stage 20 and the wafer chuck 18. In addition, the measurement chamber 14 includes a moving mechanism for moving the alignment device at an intermediate position of four measurement chambers 14 which are arranged in the X direction. Note that an alignment device 38 is shown in FIG. 7. In addition, the illustration of the moving mechanism for moving the alignment device 38 is omitted.

The head stage 20 includes a pogo frame. The pogo frame is positioned (aligned) with respect to the head stage 20 by using a positioning mechanism provided on the head stage 20. The pogo frame is mounted on the head stage 20 from an upper side of the head stage 20 in the Z-axis direction.

Figure 9:
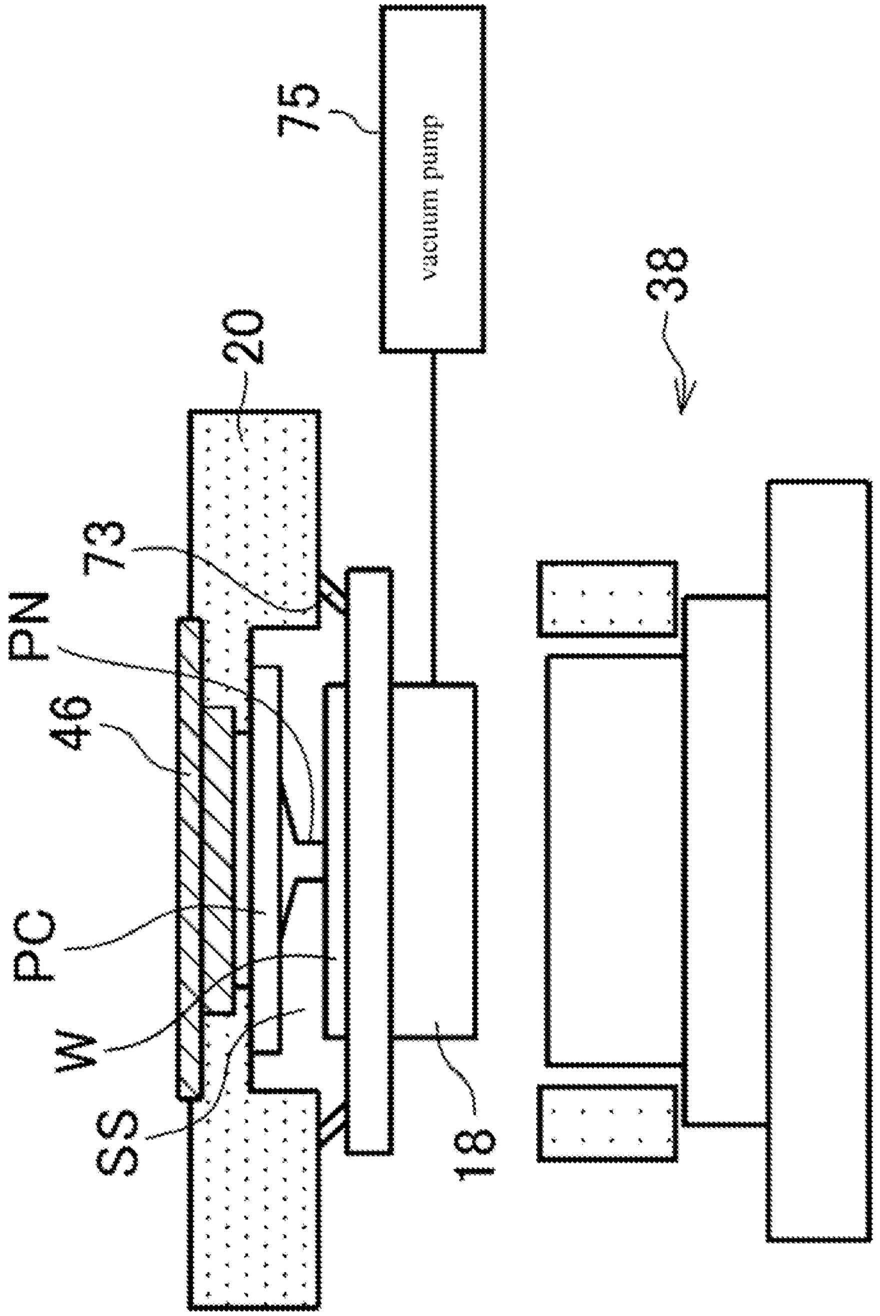
FIG. 9 is an explanation drawing showing a state that the head stage and a wafer chuck are connected with each other.

The pogo frame provides an electrical connection between the test head and the probe card. The test signal transmitted from the test head is transmitted to the semiconductor chips formed on the wafer via a probe needle provided on the probe card. The pogo frame is replaced in accordance with the kind of the wafer to be examined. Note that the illustration of the pogo frame is omitted in FIG. 1. A pogo frame 46 is shown in FIG. 9.

The conveyance unit 16 receives a conveyed article, which is one of the wafer and the probe card PC, from the conveyed article housing portion 12 and transfers the conveyed article to the measurement chamber 14 via the first opening 14*a*. In addition, the conveyance unit 16 receives the conveyed article from the measurement chamber 14 via the first opening 14*a* and transfers the conveyed article to the conveyed article housing portion 12.

The conveyance unit 16 is supported so as to be freely movable in the X-axis direction and the Z-axis direction. Namely, the conveyance unit 16 is supported by using an X-axis moving device for moving the conveyance unit 16 in the X-axis direction and supported by using a Z-axis moving device for moving the conveyance unit 16 in the Z-axis direction. Consequently, the conveyance unit 16 can access to all of the plurality of measurement chambers 14.

Two conveyance units 16 for holding the probe card PC at the tip of a probe card holding arm 16*c* are illustrated in FIG. 1. The number of the conveyance units 16 can be one, three or more.

The moving device 22 includes the X-axis moving device for moving the conveyance unit 16 in the X-axis direction and the Z-axis moving device for moving the conveyance unit 16 in the Z-axis direction. The moving device 22 moves the conveyance unit 16 in the X-axis direction and moves the conveyance unit 16 in the Z-axis direction. Note that the moving device 22 is schematically illustrated by using the dash-dotted line.

FIG. 2 is a perspective view of the prober 10 viewed from the maintenance area A2. A second opening 14*b* is formed on one end (the maintenance area A2 side) of the measurement chamber 14. Namely, the first opening 14*a* and the second opening 14*b* are arranged to face each other in the Y-axis direction in the measurement chamber 14. A not-illustrated center shutter is attached to the second opening 14*b* similar to the first opening 14*a*. Note that the illustration of the head stage 20 is omitted in FIG. 2.

The head stage 20 and the test head 44 arranged in the measurement chamber 14 are pulled out to the maintenance area A2 via the second opening 14*b*. Namely, the head stage 20 is supported by using the first sliding mechanism for sliding the head stage 20 along the Y-axis direction. Similarly, the test head 44 is supported by using the second sliding mechanism for sliding the test head 44 along the Y-axis direction.

The operator can unlock the lock mechanism and pull out the head stage 20 and the test head 44 from the measurement chamber 14 to the maintenance area A2. Note that the illustration of the first sliding mechanism and the second sliding mechanism is omitted in FIG. 2. The first sliding mechanism 54 and the second sliding mechanism 50 are illustrated in FIG. 3.

Figure 3:
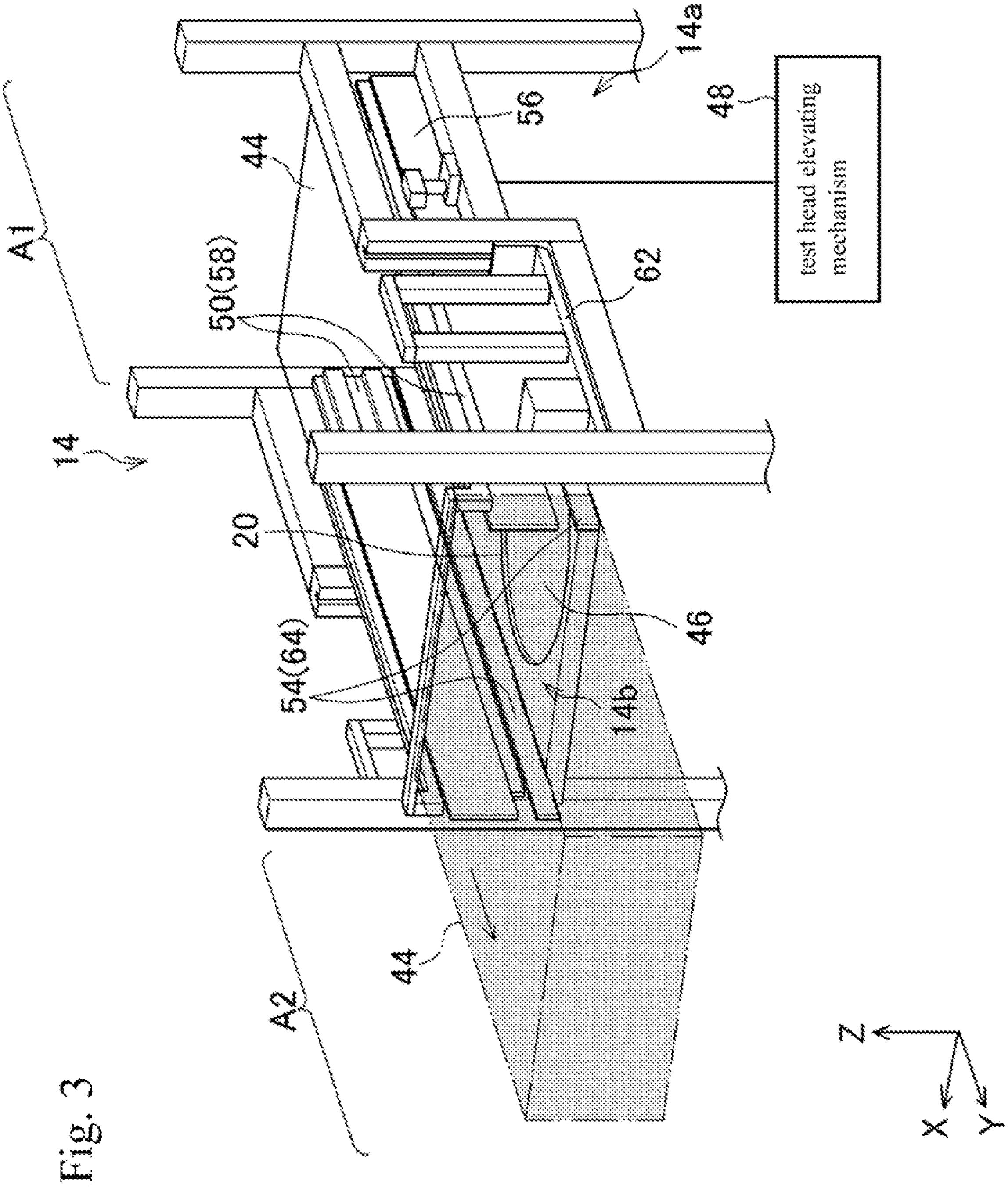
FIG. 3 is a partially enlarged perspective view showing an example of an internal structure of a measurement chamber.

FIG. 3 is a partially enlarged perspective view showing an example of an internal structure of the measurement chamber 14. A test head supporting mechanism for supporting the test head 44 freely movable in the Y-axis direction is provided inside the measurement chamber 14. The test head supporting mechanism includes a base 56 and two test head guide rails 58 (second sliding mechanism 50) fixed on the base 56 and extended in the Y-axis direction.

The base 56 constituting the test head supporting mechanism is supported by using a vertical guide rail extending in the Z-axis direction so as to be freely elevatable along the Z-axis direction. In addition, the base 56 is equipped with the lock mechanism for locking the test head 44. Conventionally known structures can be applied to the lock mechanism. Note that the illustration of the vertical guide rail and the lock mechanism is omitted.

A test head elevating mechanism 48 for elevating the test head 44 along the Z-axis direction is provided inside the measurement chamber 14. Actuators such as an air cylinder and a hydraulic cylinder can be applied to the test head elevating mechanism 48. For example, the test head elevating mechanism 48 has the structure where one end of the actuator is connected to the base 56 while the other end of the actuator is connected to the head stage 20.

The test head 44 illustrated by using the solid line in FIG. 3 is the test head 44 located at the position electrically connected with the probe card PC. On the other hand, the test head 44 surrounded by the two-dot chain line and illustrated by dots as a gray shadow is the test head 44 located at the position pulled out to the maintenance area A2 (in the direction of the arrow mark).

The pogo frame 46 is provided inside the measurement chamber 14. The test head 44 is electrically connected with the probe card PC via the pogo frame 46 when performing the electric test of the semiconductor chips formed on the wafer. The pogo frame 46 is supported by using head stage guide rails 64 so as to be freely slidable in the Y-axis direction.

The head stage 20 on which the pogo frame 46 is mounted is held by using a head stage supporting mechanism. The head stage supporting mechanism includes a base 62 and two head stage guide rails 64 (first sliding mechanism 54) fixed on the base 62 and extended in the Y-axis direction. The head stage 20 is supported by using the head stage guide rails 64 so as to be freely slidable in the Y-axis direction.

The base 62 constituting the head stage supporting mechanism is equipped with a lock mechanism for locking the head stage 20. Conventionally known structures can be applied to the lock mechanism. Note that the illustration of the lock mechanism is omitted.

Configuration Example of Conveyance Unit

FIG. 4 is a perspective view of the conveyance unit 16 showing a state that the wafer W is mounted. The conveyance unit 16 includes a wafer holding arm 16*b* for conveying the wafer W and a wafer moving mechanism for moving the wafer holding arm 16*b*. The wafer holding arm 16*b* and the wafer moving mechanism are arranged inside a housing 16*a*. The wafer holding arm 16*b* reciprocally moves between the inside of the housing 16*a* and the outside of the housing 16*a* via an opening 16*f*. Note that the illustration of the wafer moving mechanism is omitted.

Namely, the conveyance unit 16 operates the wafer moving mechanism to extend the wafer holding arm 16*b*, receives the wafer W from the conveyed article housing portion 12 and contracts the wafer holding arm 16*b* to house the wafer W inside of the conveyance unit 16.

The conveyance unit 16 includes a rotation mechanism 28. The rotation mechanism 28 rotates the conveyance unit 16 around a rotation axis which is aligned along the Z-axis direction. The rotation mechanism 28 includes a driving motor whose shaft is connected to the rotation axis. Note that the illustration of the driving motor is omitted.

The rotation mechanism 28 can rotate the conveyance unit 16 by 180 degrees in each of the normal rotation direction and the reverse rotation direction. Alternatively, the rotation mechanism 28 can rotate the conveyance unit 16 by 360 degrees in any one of the normal rotation direction and the reverse rotation direction.

Namely, the rotation mechanism 28 can switch the conveyance unit 16 between a state that the opening 16*f* is directed toward the conveyed article housing portion 12 and a state that the opening 16*f* is directed toward the first opening 14*a* of the measurement chamber 14.

Figure 5:
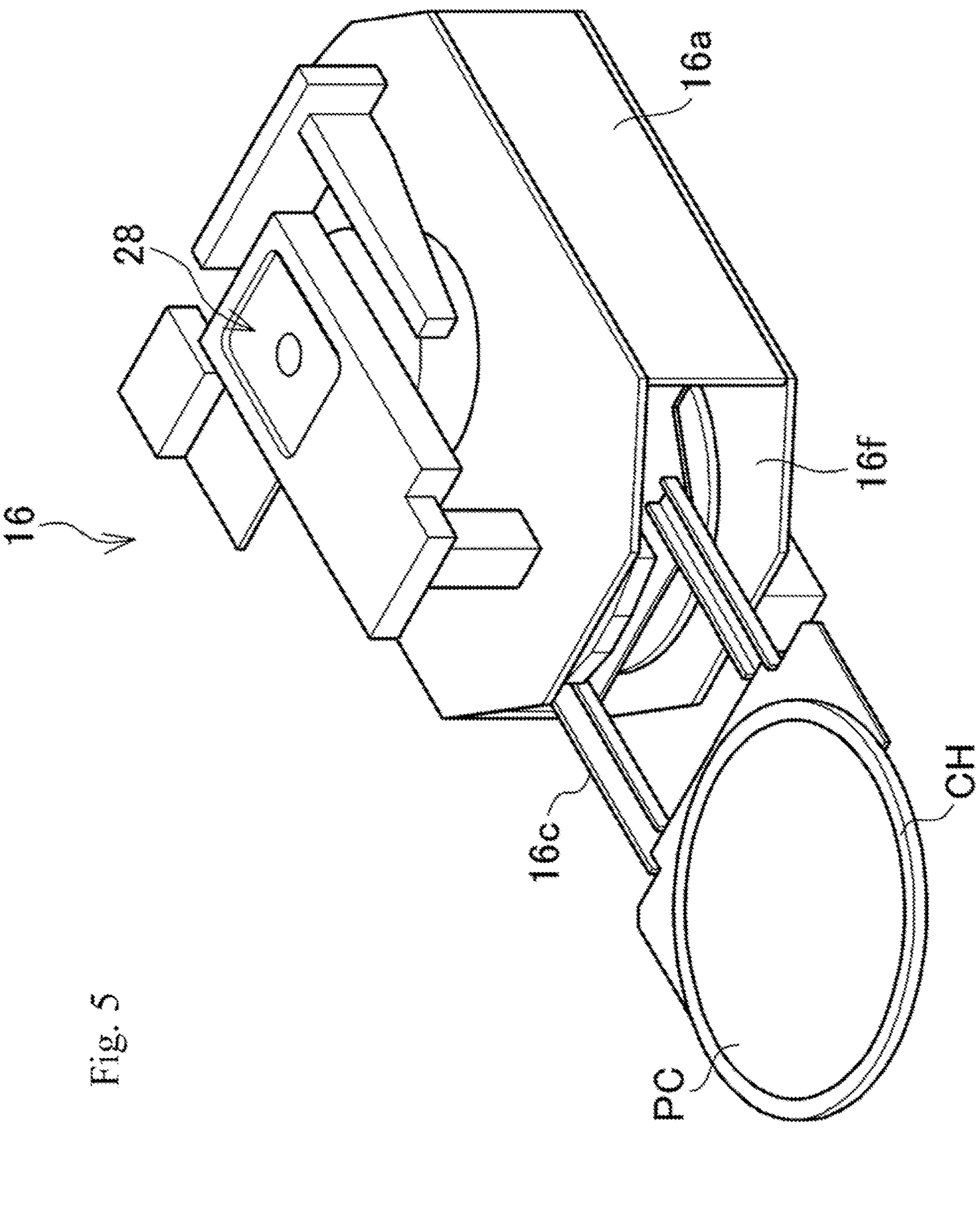
FIG. 5 is a perspective view of the conveyance unit showing a state that a probe card is mounted.

FIG. 5 is a perspective view of the conveyance unit 16 showing a state that the probe card PC is mounted. The conveyance unit 16 includes a probe card holding arm 16*c* for conveying the probe card PC and a probe card moving mechanism for moving the probe card holding arm 16*c*.

The probe card holding arm 16*c* and the probe card moving mechanism are arranged inside the housing 16*a*. The probe card holding arm 16*c* reciprocally moves between the inside of the housing 16*a* and the outside of the housing 16*a* via the opening 16*f*. Note that the illustration of the probe card moving mechanism is omitted.

Namely, the conveyance unit 16 operates the probe card moving mechanism to extend the probe card holding arm 16*c*, receives the probe cards PC from the conveyed article housing portion 12 and contracts the probe card holding arm 16*c* to house the probe cards PC inside of the conveyance unit 16.

The conveyance unit 16 shown in FIG. 4 and FIG. 5 can include an opening/closing portion for opening/closing the opening 16*f*. Opening/closing mechanisms such as a shutter and an air curtain generation unit for generating an air curtain can be applied to the opening/closing portion.

The conveyance unit 16 can include an environment maintaining unit for constantly maintaining environment parameters such as a temperature and a humidity inside the housing 16*a*. A heat source for supplying hot air or cold air and a humidifying/dehumidifying device can be applied to the environment maintaining unit. The conveyance unit 16 can include sensors such as a temperature sensor and a humidity sensor for detecting the environment parameters.

Figure 6:
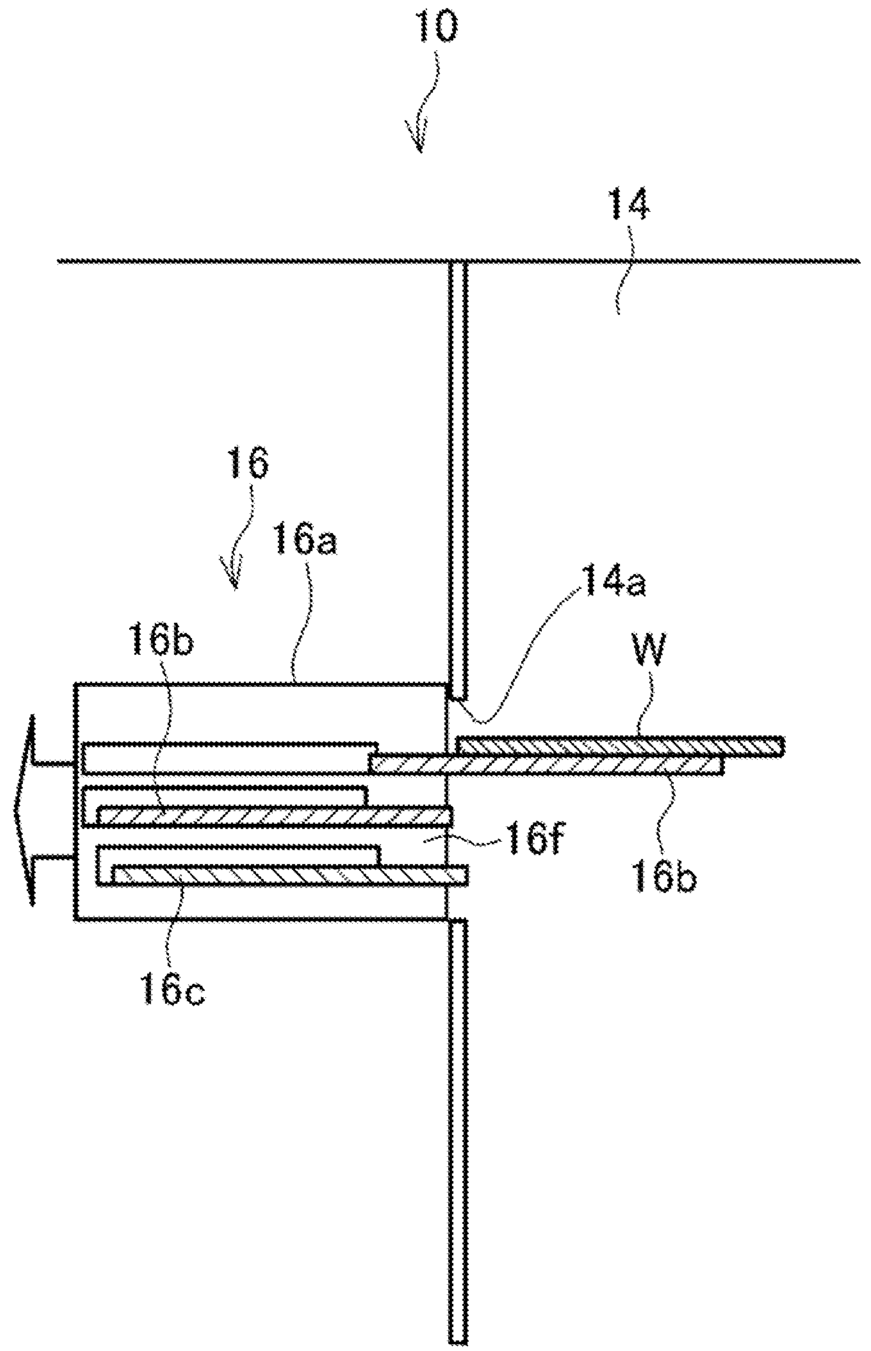
FIG. 6 is a cross-sectional view showing a use state of the conveyance unit and a schematic diagram showing a state that the wafer is conveyed.

FIG. 6 is a cross-sectional view showing a use state of the conveyance unit 16 and a schematic diagram showing a state that the wafer W is conveyed. FIG. 6 schematically illustrates the state that the wafer W supported by using the wafer holding arm 16*b* is conveyed into the measurement chamber 14.

The conveyance unit 16 houses the wafer W taken out from the wafer housing portion 12*a* inside the housing 16*a*, rotates the wafer W by 180 degrees by using the rotation mechanism 28, and the opening 16*f* is directed toward the first opening 14*a* of the measurement chamber 14. The conveyance unit 16 extends the wafer holding arm 16*b* and the wafer W housed inside the housing 16*a* is conveyed inside the measurement chamber 14.

FIG. 7 is a cross-sectional view showing a use state of the conveyance unit 16 and a schematic diagram showing a state that the probe card is conveyed. FIG. 7 illustrates the state that the probe card PC is conveyed inside the measurement chamber 14 and the probe card PC is transferred to the support portion 40*a* of the second probe card supporting mechanism 40.

The measurement chamber 14 is equipped with the alignment device 38. The alignment device 38 supports the wafer chuck 18 and adjusts the position of the wafer chuck 18 with respect to a first probe card supporting mechanism 36 provided on the head stage 20. FIG. 7 illustrates the alignment device 38 located at the receiving position P1 where the alignment device 38 receives the probe cards PC.

The alignment device 38 includes a Z-axis moving unit 38*a*. The Z-axis moving unit 38*a* moves the second probe card supporting mechanism 40 in the Z-axis direction. The alignment device 38 includes a Z-axis fixing unit 38*b* and an XY moving unit 38*c*. The Z-axis fixing unit 38*b* fixes the Z-axis moving unit 38*a* to the XY moving unit 38*c*. The XY moving unit 38*c* supports the Z-axis moving unit 38*a* and moves the Z-axis moving unit 38*a* supporting the wafer chuck 18 in the X direction and the Y direction.

The second probe card supporting mechanism 40 includes a support portion 40*a* for supporting the probe card PC. The support portion 40*a* is attached to the Z-axis moving unit 38*a*. A ring-shaped member, a plurality of annually arranged pins or the like can be applied to the support portion 40*a*. In addition, the second probe card supporting mechanism 40 includes an elevating mechanism for elevating the support portion 40*a* with respect to the Z-axis moving unit 38*a* in the Z-axis direction. Note that the illustration of the elevating mechanism is omitted.

[Conveyance of Wafer and Probe Card in Measurement Chamber]

Figure 8:
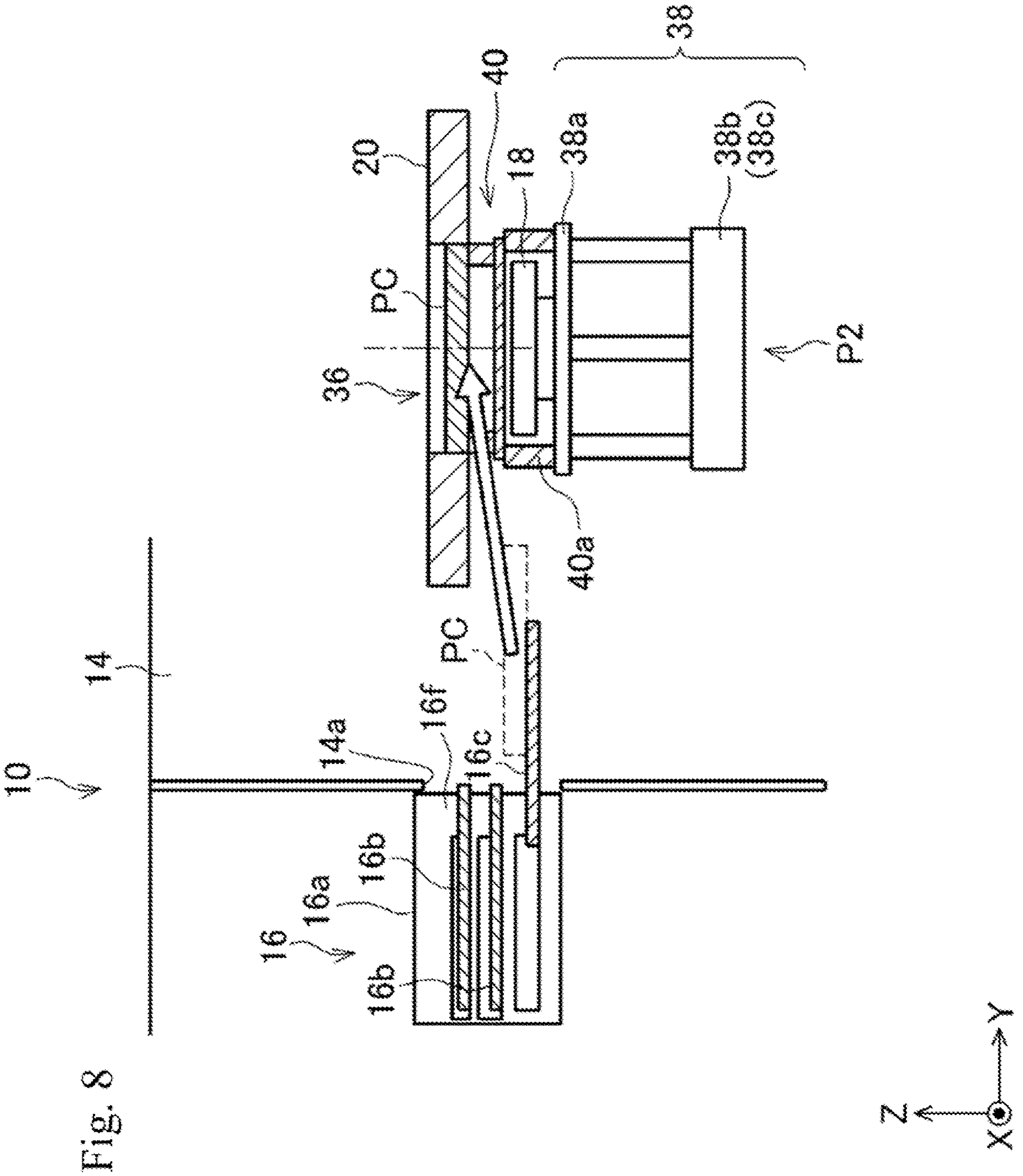
FIG. 8 is a schematic diagram showing a state that of the probe card is attached to a head stage.

FIG. 8 is a schematic diagram showing a state that of the probe card PC is attached to a head stage 20. FIG. 8 illustrates the state that the alignment device 38 is moved from the receiving position P1 shown in FIG. 7 to the position P2 immediately below the head stage 20 shown in FIG. 8.

In the position P2, the alignment device 38 operates the Z-axis moving unit 38*a* to convey the probe card PC to the position of the first probe card supporting mechanism 36. The first probe card supporting mechanism 36 supports the probe card PC so as to be detachable. Namely, the probe card PC is held by the head stage 20 using the first probe card supporting mechanism 36 so as to be detachable.

FIG. 9 is an explanation drawing showing a state that the head stage 20 and the wafer chuck 18 are connected with each other. FIG. 9 schematically illustrates the state that the wafer W supported by the wafer chuck 18 is positioned with respect to the pogo frame 46 and the head stage 20 on which the probe card PC is mounted and a probe needle PN is in contact with the wafer W.

The wafer W shown in FIG. 6 is transferred to the wafer chuck 18 at the receiving position P1 shown in FIG. 7. The wafer W transferred to the wafer chuck 18 is moved to the position P2 using the alignment device 38, raised at the position P2, and positioned with respect to the probe card PC mounted on the head stage 20.

The wafer chuck 18 includes a seal member 73. The seal member 73 has elasticity and has a ring shape corresponding to the shape of the upper surface of the wafer chuck 18. The seal member 73 seals between the probe card PC and the upper surface of the wafer chuck 18 and forms a sealed space SS between the probe card PC and the upper surface of the wafer chuck 18.

A suction port is formed on the upper surface of the wafer chuck 18. The suction port is connected to a vacuum pump 75 via a gas passage formed inside the wafer chuck 18. The vacuum pump 75 depressurizes the sealed space SS so that the sealed space SS is brought into vacuum state. When the sealed space SS is brought into vacuum state, the wafer chuck 18 is fixed to the head stage 20 and the probe card PC and the wafer W are electrically connected with each other. Thus, the electric test can be started in this state.

[Sequence of Electric Test Applied to Prober]

Figure 10:
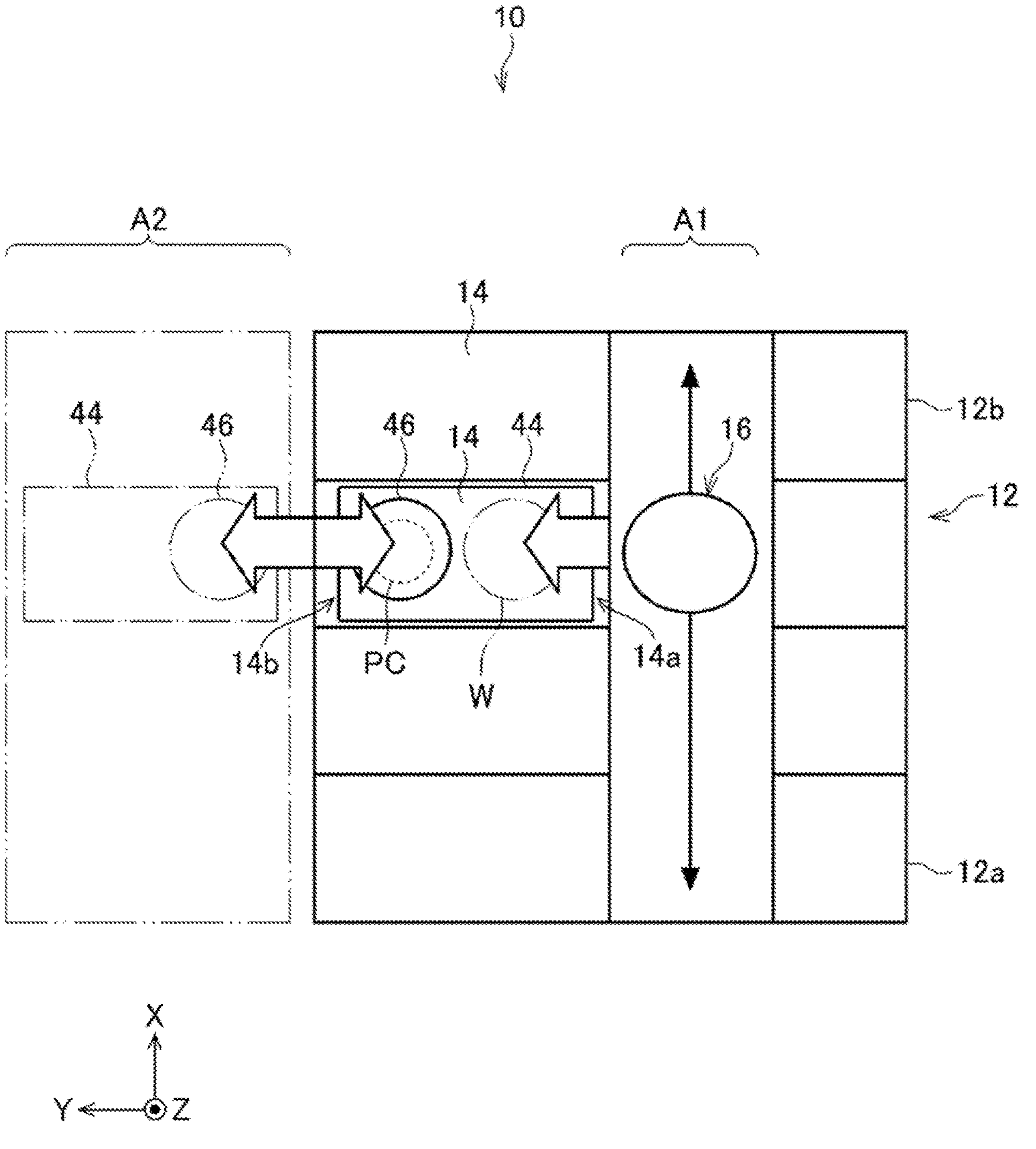
FIG. 10 is an explanation drawing of a movement path of the wafer and the probe card when an electric test is performed.

FIG. 10 is an explanation drawing of a movement path of the wafer W and the probe card PC when an electric test is performed. In FIG. 10, the conveying directions of the wafer W and the like in the sequence of the electric test are shown in the plan view (schematic view) of the prober 10 by arrow lines.

In the electric test of the wafer W, first of all, the wafer W to be examined is taken out from the wafer housing portion 12*a* using the conveyance unit 16. Namely, the conveyance unit 16 is moved to the position of the wafer housing portion 12*a* where the wafer W to be examined is housed, the conveyance unit 16 is entered inside the wafer housing portion 12*a* and the wafer W to be examined is taken out from the wafer housing portion 12*a*.

Then, the conveyance unit 16 is moved to the position of the measurement chamber 14 defined as the destination of conveying the wafer W, and the wafer W is loaded to the wafer chuck 18 arranged inside the measurement chamber 14 via the first opening 14*a*. The wafer W loaded to the wafer chuck 18 is vacuum-sucked to the wafer chuck 18.

The operator waits until the wafer chuck 18 to which the wafer W is vacuum-sucked reaches the test temperature. When the wafer chuck 18 reaches the test temperature, the wafer W is aligned with the probe card PC using the alignment device 38.

The wafer W aligned with the probe card PC is brought into contact with the probe needle PN. Thus, the test signals are transmitted from the test head 44 to the wafer W via the pogo frame 46 and the electric test of the wafer W is performed.

When replacing the probe card PC, the same procedure as the replacement of the wafer W is applied. The probe cards PC is conveyed from the probe card housing portion 12*b* to the measurement chamber 14, the probe card PC is aligned with the head stage 20 in the measurement chamber 14, and the probe card PC is mounted on the head stage 20.

The replacement of the pogo frame 46 is performed in the maintenance area A2. Namely, the head stage 20 is pulled out from the measurement chamber 14 to the maintenance area A2 and the pogo frame 46 to be replaced is detached from the head stage 20. The pogo frame 46 used for the electric test is mounted on the head stage 20 from which the pogo frame 46 to be replaced is detached and the head stage 20 is returned from the maintenance area A2 to the measurement chamber 14.

First Embodiment of Temperature Measurement Method

Figure 11:
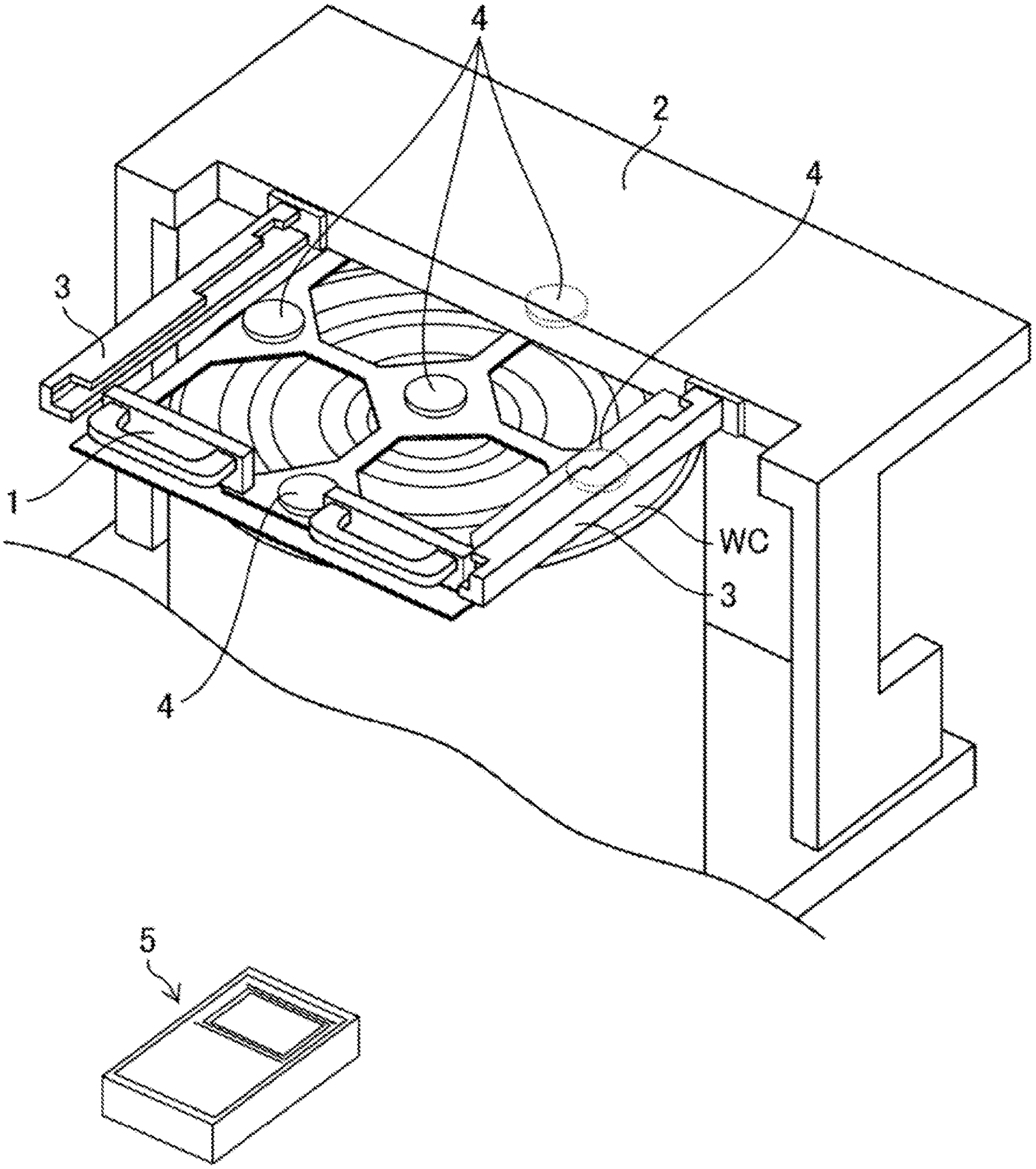
FIG. 11 is a schematic diagram based on the prior art showing a state that the temperature measurement of the wafer chuck is performed.

FIG. 11 is a schematic diagram based on the prior art showing a state that the temperature measurement of the wafer chuck is performed. In the temperature measurement of the prior art, the operator enters in the conveyance area A1 shown in FIG. 1 for each temperature range applied to the electric test and the center shutter of the measurement chamber 14 for measuring the temperature is opened, a temperature measurement jig 1 is mounted, and the temperature measurement is performed by using the temperature measurement jig 1.

FIG. 11 illustrates a state that the temperature measurement jig 1 is supported by using a guide rail 3 attached to a frame 2 arranged inside the measurement chamber 14. The temperature measurement jig 1 is inserted into grooves of the guide rail 3, slid in the direction of extending the guide rail 3 and aligned with a wafer chuck WC.

The temperature measurement jig 1 includes a plurality of temperature sensors 4. In a state that the temperature measurement jig 1 and the wafer chuck WC are aligned with each other, the plurality of temperature sensors 4 is in contact with the upper surface of the wafer chuck WC. The operator acquires the temperature of the wafer chuck WC measured by the temperature sensors 4 by operating a measurement terminal 5. The operator creates the correction table by applying a predetermined procedure (e.g., calculation formula) to the temperature measurement data of the wafer chuck WC. Specifically, the correction table is created from the temperature measurement data of the wafer chuck WC by using the macro installed in the measurement terminal 5. After that, the operator operates the measurement terminal 5 to transmit the correction table to the control device of the prober.

Figure 12:
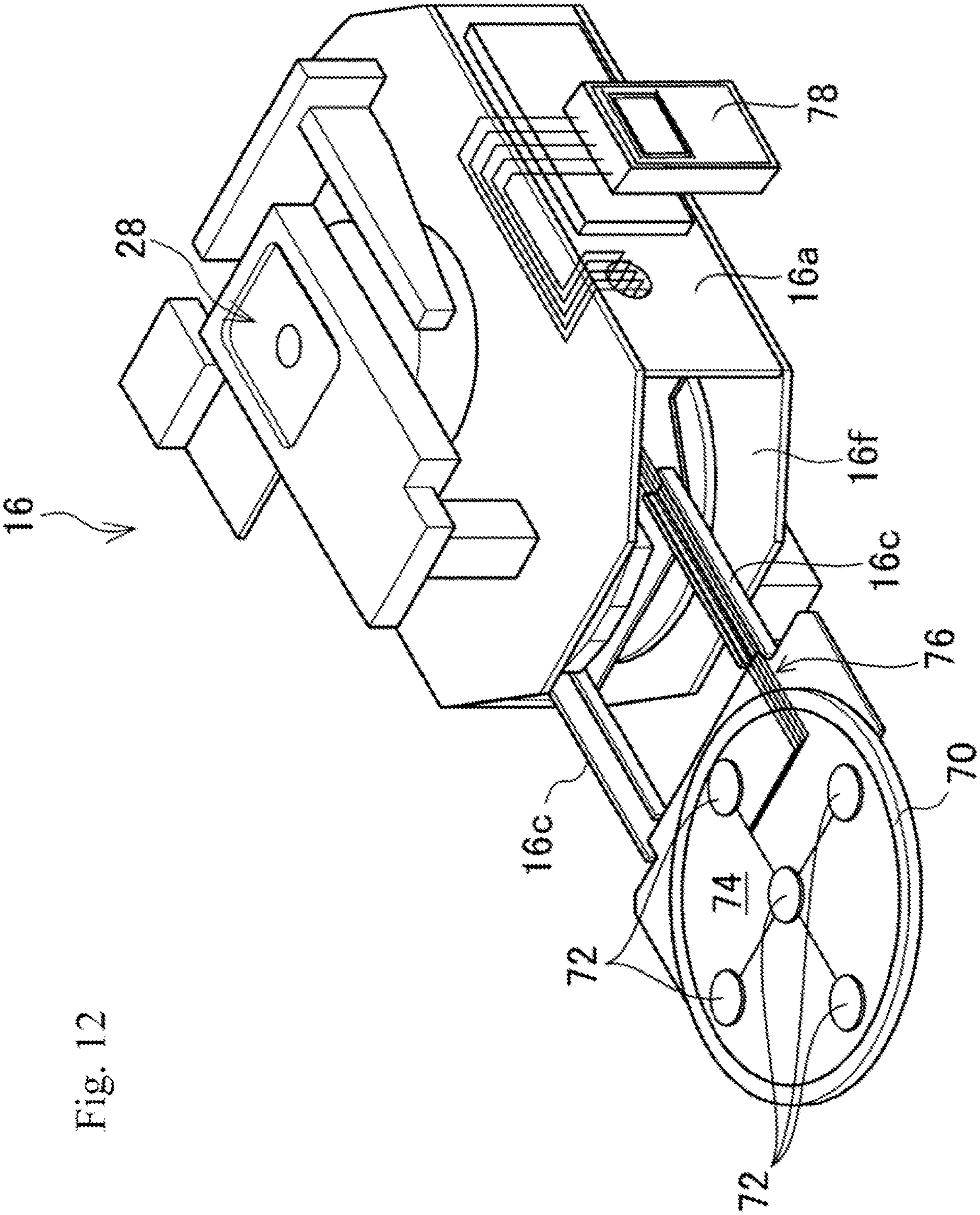
FIG. 12 is a perspective view of a conveyance unit 16 and a temperature measurement jig 70 for performing a temperature measurement method (first embodiment) of the wafer chuck.

FIG. 12 is a perspective view of the conveyance unit 16 and the temperature measurement jig 70 for performing a temperature measurement method (first embodiment) of the wafer chuck. The temperature measurement jig 70 is supported at the tip of the probe card holding arm 16*c* of the conveyance unit 16. In a state that the temperature measurement jig 70 is supported by the extended probe card holding arm 16*c*, the temperature measurement jig 70 makes temperature sensors 72 bring into contact with the wafer chuck 18 (not illustrated in FIG. 12) which is the object of the temperature measurement.

The temperature measurement jig 70 includes one or more temperature sensors 72. One temperature sensor 72 is arranged at the center portion of a main body 74 having a circular shape. In addition, four temperature sensors 72 are arranged along an outer periphery of the main body 74 at equal intervals. Note that the number and the arrangement of the plurality of temperature sensors 72 are not limited to the configuration shown in FIG. 12.

Each of the plurality of temperature sensors 72 is arranged avoiding the position of the seal member 73 (FIG. 9) provided on the wafer chuck 18. In addition, each of the plurality of temperature sensors 72 has the thickness exceeding the thickness of the seal member 73. Consequently, the interference between the temperature sensors 72 and the seal member 73 is hardly caused. Thus, the temperature can be measured more correctly. Specifically, it is possible to reduce the case where the temperature is measured lower than the actual temperature.

The temperature measurement jig 70 includes a plurality of sensor wirings. Each of the plurality of sensor wirings is electrically connected with each of the plurality of temperature sensors 72 to transmit the sensor signal outputted from each of the plurality of temperature sensors 72 to a thermologger 78. The thermologger 78 transmits the temperature measurement data of the wafer chuck 18 measured by using the plurality of temperature sensors 72 to the control device of the prober 10.

The plurality of sensor wirings is electrically connected with the thermologger 78 attached to the external part of the housing 16*a* via the main body 74 of the temperature measurement jig 70, the probe card holding arm 16*c* of the conveyance unit 16 and the inside of the housing 16*a*.

The temperature measurement jig 70 and the thermologger 78 are attached to the conveyance unit 16 which is directed toward the conveyed article housing portion 12 in the conveyance area A1. After the temperature measurement jig 70 is housed inside the housing 16*a* of the conveyance unit 16, the conveyance unit 16 is rotated by 180 degrees and the probe card holding arm 16*c* is extended toward the inside of the measurement chamber 14, the temperature measurement jig 70 is arranged at the receiving position P1 of the measurement chamber 14. The temperature measurement jig 70 makes the plurality of temperature sensors 72 and the upper surface of the wafer chuck 18 bring into contact with each other in the receiving position P1. In a state that the probe card holding arm 16*c* is extended, the prober 10 automatically performs the temperature measurement of the wafer chuck 18. Note that the temperature measurement jig 70 is an example of the temperature measurement jig which can be supported at a position where the probe card is supported. The thermologger 78 is an example of the measured data collecting device for collecting the temperature measurement data of the wafer chuck.

[Electrical Configuration of Prober]

FIG. 13 is a functional block diagram showing an electrical configuration of the first embodiment of the prober. A control device 100 integrally controls the prober 10. A computer is applied to the control device 100. The control device 100 executes various programs to achieve various functions equipped in the prober 10. The control device 100 can be arranged in the main body of the prober 10 while the control device 100 can be arranged outside the prober 10.

The type of the computer applied to the control device 100 can be a server, a personal computer, a work station, a tablet terminal or the like. The type of the computer applied to the control device 100 can be a virtual machine.

The various programs can be stored in a memory device provided on the control device 100 or stored in a memory device provided on an outside of the control device 100 and an inside of the prober 10. It is also possible for the control device 100 to acquire the various programs from the memory device of the outside of the prober 10.

The control device 100 includes an arithmetic circuit comprising various processors, memories and the like. CPU (Central Processing Unit), GPU (Graphics Processing Unit), ASIC (Application Specific Integrated Circuit), programmable logic device and the like can be examples of the various processors.

SPLD (Simple Programmable Logic Devices), CPLD (Complex Programmable Logic Device), FPGA (Field Programmable Gate Arrays) and the like can be examples of the programmable logic device. Various functions of the control device 100 can be achieved by using one processor or using a plurality of processors. The plurality of processors can be the same kind of plurality of processors or different kinds of plurality of processors from each other.

The control device 100 includes various communication interfaces. The control device 100 is freely communicably connected to peripheral devices via the various communication interfaces. Various standards such as USB can be applied to the communication interfaces. Both wired communication and wireless communication can be applied to the communication mode of the communication interfaces. Note that USB is an abbreviated word of Universal Serial Bus. In addition, USB is the registered trademark.

The control device 100 includes a conveyance unit controller 102. The conveyance unit controller 102 transmits the operation commands to the conveyance unit 16 to control the operation of the conveyance unit 16. The operation of the conveyance unit 16 includes the extension of the wafer holding arm 16*b*, the extension of the probe card holding arm 16*c*, the rotation of the conveyance unit 16 and the like.

The control device 100 includes a moving device controller 104. The moving device controller 104 transmits the operation commands to the moving device 22 to control the operation of the moving device 22. The moving device controller 104 can include an X-axis moving control unit which controls the operation of the X-axis moving device for moving the conveyance unit 16 in the X-axis direction and a Z-axis moving control unit which controls the operation of the Z-axis moving device for moving the conveyance unit 16 in the Z-axis direction.

The control device 100 includes an alignment controller 106. The alignment controller 106 transmits the operation commands to the alignment device 38 to control the operation of the alignment device 38. The operation of the alignment device 38 includes the alignment operation of the wafer W and the alignment operation of the probe card PC.

The control device 100 includes a chuck temperature controller 108. The chuck temperature controller 108 controls the operation of a chuck temperature regulator 18*a* provided on the wafer chuck 18 to control the temperature of the wafer chuck 18. The operation of the chuck temperature regulator 18*a* typically includes the heating and the cooling.

The control device 100 includes a chuck temperature setting unit 110. The chuck temperature setting unit 110 specifies a predetermined temperature of the wafer chuck 18 applied to the electric test of the wafer W. The chuck temperature controller 108 controls the temperature of the wafer chuck 18 based on the value of the temperature specified by the chuck temperature setting unit 110.

The control device 100 includes a chuck temperature acquisition unit 112. The chuck temperature acquisition unit 112 acquires the temperature measurement data of the wafer chuck 18 acquired by using the plurality of temperature sensors 72 provided on the temperature measurement jig 70. Namely, the chuck temperature acquisition unit 112 acquires the temperature measurement data of the wafer chuck 18 from the temperature sensors 72 via the thermologger 78 attached to the conveyance unit 16.

The control device 100 includes a correction table generating unit 114. The correction table generating unit 114 creates the correction table applied to the temperature control of the wafer chuck 18 based on the temperature measurement data of the wafer chuck 18 acquired by using the chuck temperature acquisition unit 112. The chuck temperature controller 108 performs the temperature correction by referring to the correction table created by using the correction table generating unit 114. The control device 100 automatically installs the created correction table.

The control device 100 includes a center shutter controller 116. The center shutter controller 116 controls the opening/closing of the center shutter 14*d*. The center shutter controller 116 can switch the mode to a manual operation mode where the opening/closing of the center shutter 14*d* can be performed manually.

Note that the conveyance unit controller 102 and the moving device controller 104 described in the embodiment are examples of the components of the conveyance controller for controlling the operation of the conveyance device. The sensor wiring described in the embodiment is an example of the electric wiring.

Procedure of Temperature Measurement Method of First Embodiment

Figure 14:
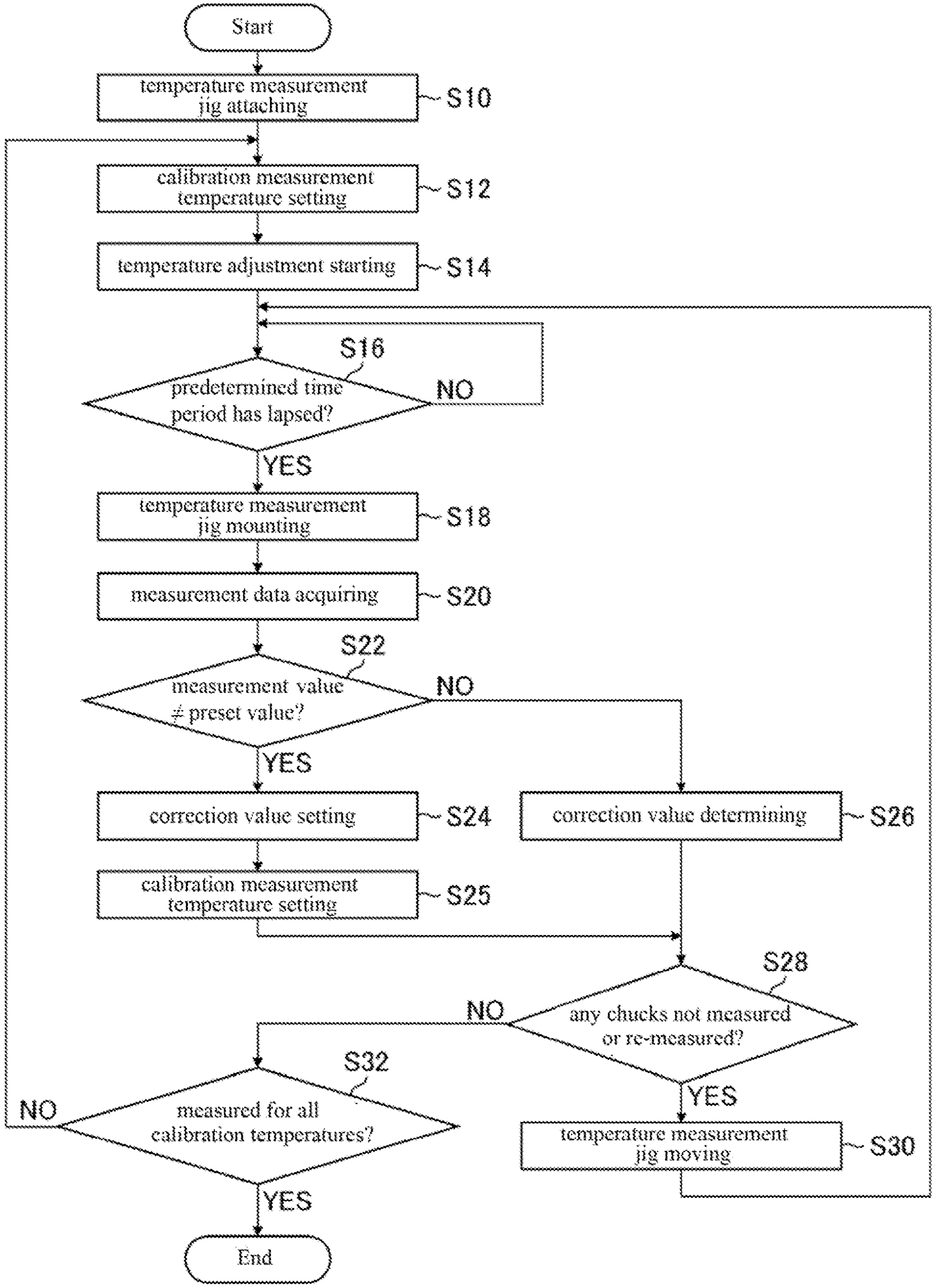
FIG. 14 is a flowchart showing procedures of the first embodiment of the temperature measurement method.

FIG. 14 is a flowchart showing procedures of the temperature measurement method (first embodiment) performed by using the temperature measurement jig 70 shown in FIG. 12. The temperature measurement method whose procedures are shown in FIG. 14 is performed when creating the temperature correction table of the wafer chuck 18.

In a temperature measurement jig attaching process S10, the operator attaches the temperature measurement jig 70 to the conveyance unit 16. In the temperature measurement jig attaching process S10, the operator also attaches the sensor wirings and the thermologger 78 to the conveyance unit 16. After the temperature measurement jig attaching process S10, the process is advanced to a calibration measurement temperature setting process S12.

In the calibration measurement temperature setting process S12, the chuck temperature setting unit 110 shown in FIG. 13 specifies a calibration measurement temperature for the wafer chuck 18 which is the object of the temperature measurement. A plurality of temperatures is preliminarily defined as the calibration measurement temperature. For example, as examples of the calibration measurement temperature, 85° C., 125° C., minus 30° C. and minus 10° C. can be listed. After the calibration measurement temperature setting process S12, the process is advanced to a temperature adjustment starting process S14.

In the temperature adjustment starting process S14, the chuck temperature controller 108 starts the temperature adjustment of the wafer chuck 18. In the temperature adjustment starting process S14, after the temperature adjustment of the wafer chuck 18 is started, a time lapse determining process S16 is performed.

In the time lapse determining process S16, the chuck temperature controller 108 determines whether or not a preliminarily defined (predetermined) time period has lapsed after starting the temperature adjustment. Namely, whether or not the time required before the temperature change of the wafer chuck 18 is converged has lapsed is determined in the time lapse determining process S16. In the time lapse determining process S16, when it is determined that the predetermined time has not lapsed yet, the determination is No and the time lapse determining process S16 is continued. On the other hand, when it is determined that the predetermined time has lapsed in the time lapse determining process S16, the determination is Yes and the process is advanced to a temperature measurement jig mounting process S18.

In the temperature measurement jig mounting process S18, in a state that the conveyance unit 16 extends the probe card holding arm 16*c*, the conveyance unit controller 102 places the temperature measurement jig 70 supported by the probe card holding arm 16*c* on the wafer chuck 18 which is the object of the temperature measurement and the temperature sensors 72 are brought into contact with the upper surface of the wafer chuck 18. After the temperature measurement jig mounting process S18, the process is advanced to a measurement data acquiring process S20.

In the measurement data acquiring process S20, the chuck temperature acquisition unit 112 acquires the temperature measurement data of the wafer chuck 18 from the thermologger 78. It is possible for the chuck temperature acquisition unit 112 to acquire the temperature measurement data for a plurality of times by applying a predetermined sampling period and calculate a representative value such as an average value of a plurality of measurement data as the temperature measurement data of the wafer chuck 18. It is possible for the chuck temperature acquisition unit 112 to calculate an intermediate value of the maximum value and the minimum value of the obtained measurement data from each of the plurality of temperature sensors 72 shown in FIG. 12. After the measurement data acquiring process S20, the process is advanced to a measurement data determining process S22.

In the measurement data determining process S22, the chuck temperature controller 108 determines whether or not the measurement temperature of the wafer chuck 18 is different from the preset (predetermined) temperature. When the temperature of the wafer chuck 18 measured in the measurement data determining process S22 is different from the preset temperature, the determination is Yes and the process is advanced to a correction setting process S24. In the correction setting process S24, the chuck temperature setting unit 110 specifies the correction temperature based on the difference between the preset temperature and the measurement temperature. For example, when the preset temperature is 85° C. and the measurement temperature is 84.5° C., the measurement temperature with respect to the preset temperature is minus 0.5° C. and plus 0.5° C. is specified as the correction value. After the correction setting process S24, the process is advanced to a calibration measurement temperature setting process S25 and the calibration measurement temperature after the correction is specified. After the calibration measurement temperature setting process S25, the process is advanced to an unmeasured chuck determining process S28.

On the other hand, when the measurement temperature of the wafer chuck 18 is matched with the preset temperature in the measurement data determining process S22, the determination is No and the process is advanced to a correction value determining process S26. In the correction value determining process S26, the correction value for the case when the determination is No in the measurement data determining process S22 is determined as the correction value of the calibration temperature. After the correction value determining process S26, the process is advanced to the unmeasured chuck determining process S28.

In the unmeasured chuck determining process S28, the chuck temperature controller 108 determines whether or not there is a wafer chuck 18 on which the temperature measurement is not performed. Alternatively, the chuck temperature controller 108 determines whether or not there is a wafer chuck 18 on which a remeasurement is not performed in the wafer chuck 18 whose calibration measurement temperature is corrected. In the unmeasured chuck determining process S28, when there is the wafer chuck 18 on which the temperature measurement is not performed or the wafer chuck 18 on which the remeasurement is not performed, the determination is Yes and the process is advanced to a temperature measurement jig moving process S30.

In the temperature measurement jig moving process S30, the conveyance unit controller 102 separates the temperature measurement jig 70 from the wafer chuck 18 on which the measurement is finished. In the temperature measurement jig moving process S30, the moving device controller 104 operates the moving device 22 to move the conveyance unit 16 in which the temperature measurement jig 70 is housed to the measurement chamber 14 equipped with the wafer chuck 18 which is the object of the temperature measurement. After the temperature measurement jig moving process S30, the process is advanced to the time lapse determining process S16 and the processes from the time lapse determining process S16 to the unmeasured chuck determining process S28 are performed for the wafer chuck 18 which is the object of the next temperature measurement. On the other hand, when there is no wafer chuck 18 on which the temperature measurement is not performed and no wafer chuck 18 on which the remeasurement is not performed in the unmeasured chuck determining process S28, the determination is No and the process is advanced to a calibration temperature determining process S32.

In the calibration temperature determining process S32, the chuck temperature controller 108 determines whether or not the temperature measurement is performed for all calibration temperatures. When there are any unmeasured calibration temperatures in the calibration temperature determining process S32, the determination is No and the process is advanced to the calibration measurement temperature setting process S12. The processes of the calibration measurement temperature setting process S12 to the calibration temperature determining process S32 are repeated until the determination becomes Yes in the calibration temperature determining process S32. On the other hand, when it is determined that the measurement is finished for all of the calibration temperatures in the calibration temperature determining process S32, the determination is Yes and the temperature measurement method is finished.

When the temperature measurement method whose procedures are shown in FIG. 14 is performed, the waiting time of the temperature measurement can be applied to the temperature measurement of the other wafer chuck 18. Thus, the measurement time is shortened as a whole when the temperature is measured for a plurality of wafer chucks 18.

[Creation of Temperature Correction Table]

When the temperature correction value is determined for all of the calibration measurement temperatures, the correction table generating unit 114 shown in FIG. 13 complements the correction value of the temperature between the calibration measurement temperatures based on the determined temperature correction value and creates the correction table. The correction table is applied to the temperature calibration of the wafer chuck 18.

Operation and Effect of First Embodiment of Prober and Temperature Measurement Method The following operation and effect can be obtained from the first embodiment of the prober and the temperature measurement method.

[1]

After the temperature measurement jig 70 is attached to the conveyance unit 16, there is no manual operation of the operator. Thus, the temperature measurement of the wafer chuck 18 in all of the measurement chambers 14 is performed automatically. Consequently, the condensation of the chamber 14 and the risk of burn injury of the operator can be avoided when measuring the temperature of the wafer chuck 18.

[2]

The automatic temperature measurement of the wafer chuck 18 is performed for all of the measurement chambers 14. Consequently, the time required for the temperature measurement of the wafer chuck 18 is expected to be shortened. Thus, the influence to the inside of the measurement chamber 14 is suppressed and the stable temperature measurement of the wafer chuck 18 is achieved.

[3]

Although the installation of the correction table is conventionally performed by the operator, the installation of the correction table is automatically performed by using the control device 100 of the prober 10. Consequently, the errors such as human error are suppressed.

[4]

After the temperature measurement jig 70 is attached to the conveyance unit 16, there is no manual operation of the operator. A continuous operation (e.g., 24 hours operation) for a long time is possible. Thus, the operation stop time of the prober 10 due to the occurrence of the measurement time can be shortened.

Second Embodiment of Temperature Measurement Method

Figure 15:
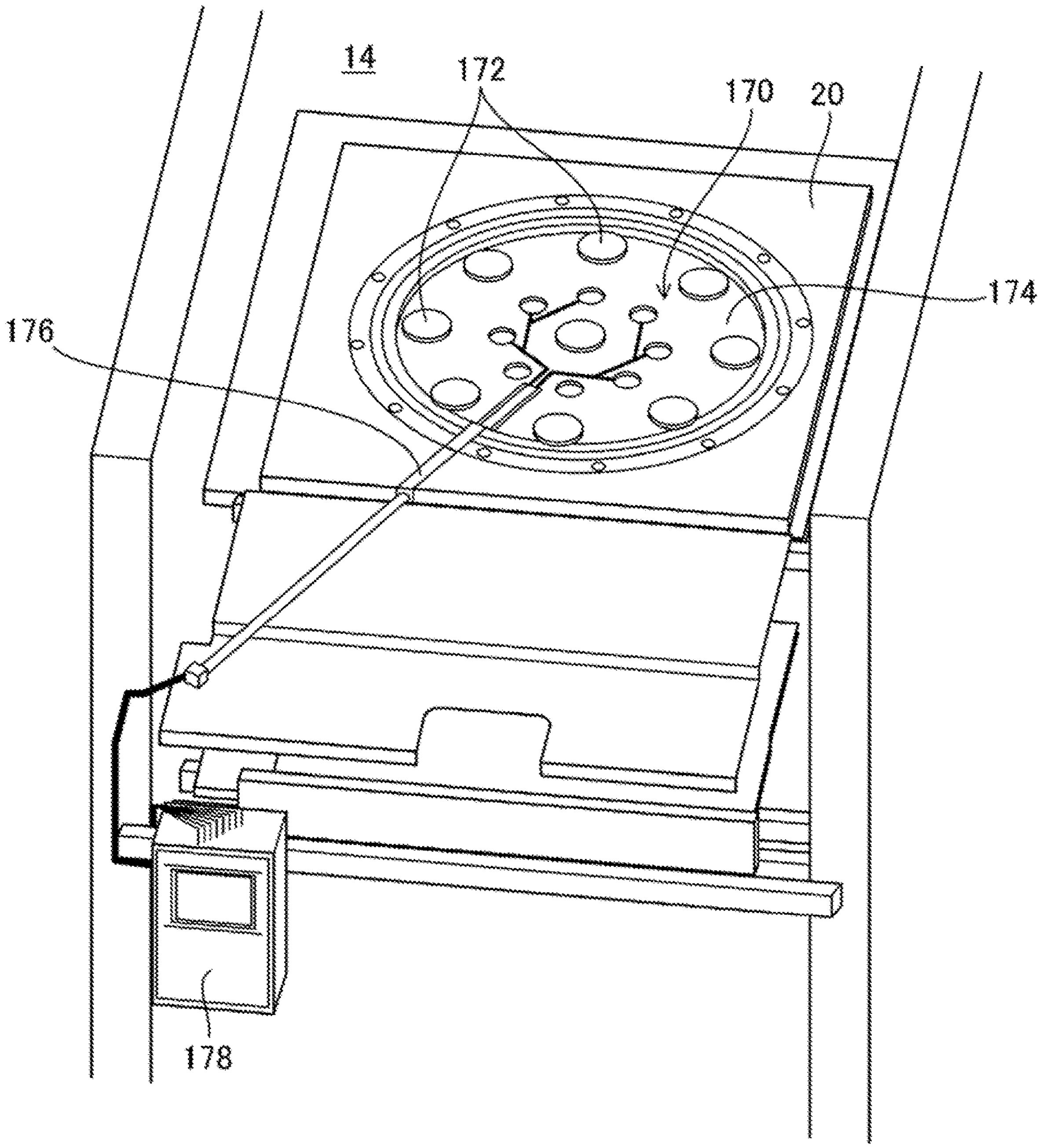
FIG. 15 is a perspective view showing a state that the temperature measurement jig is mounted on the head stage.

FIG. 15 is a perspective view showing a state that a temperature measurement jig 170 is mounted on the head stage 20. In FIG. 15, the internal structure of the measurement chamber 14 is simplified in the illustration. The wafer chuck 18 (not shown in FIG. 15), which is the object of the temperature measurement, is arranged inside the measurement chamber 14.

In FIG. 15, the pogo frame 46 is detached from the head stage 20.

The temperature measurement jig 170 is mounted on the position where the pogo frame 46 is attached to the head stage 20. The temperature measurement jig 170 has a positioning mechanism and a supporting mechanism with respect to the head stage 20 same as those of the pogo frame 46.

Each of a plurality of temperature sensors 172 is arranged avoiding the position of the seal member 73 provided on the wafer chuck 18. In addition, each of the plurality of temperature sensors 172 has a thickness capable of being in surface contact with the upper surface of the wafer chuck 18 in a state that the wafer chuck 18 is fixed to the head stage 20. Consequently, the deterioration of the temperature measurement due to the interference between the temperature sensors 172 and the seal member 73 is suppressed.

The temperature measurement jig 170 includes a plurality of temperature sensors 172 and a plurality of sensor wirings 176. Each of the plurality of sensor wirings 176 is electrically connected with each of the plurality of temperature sensors 172. The plurality of temperature sensors 172 is attached to a main body 174 of the temperature measurement jig 170.

Figure 19:
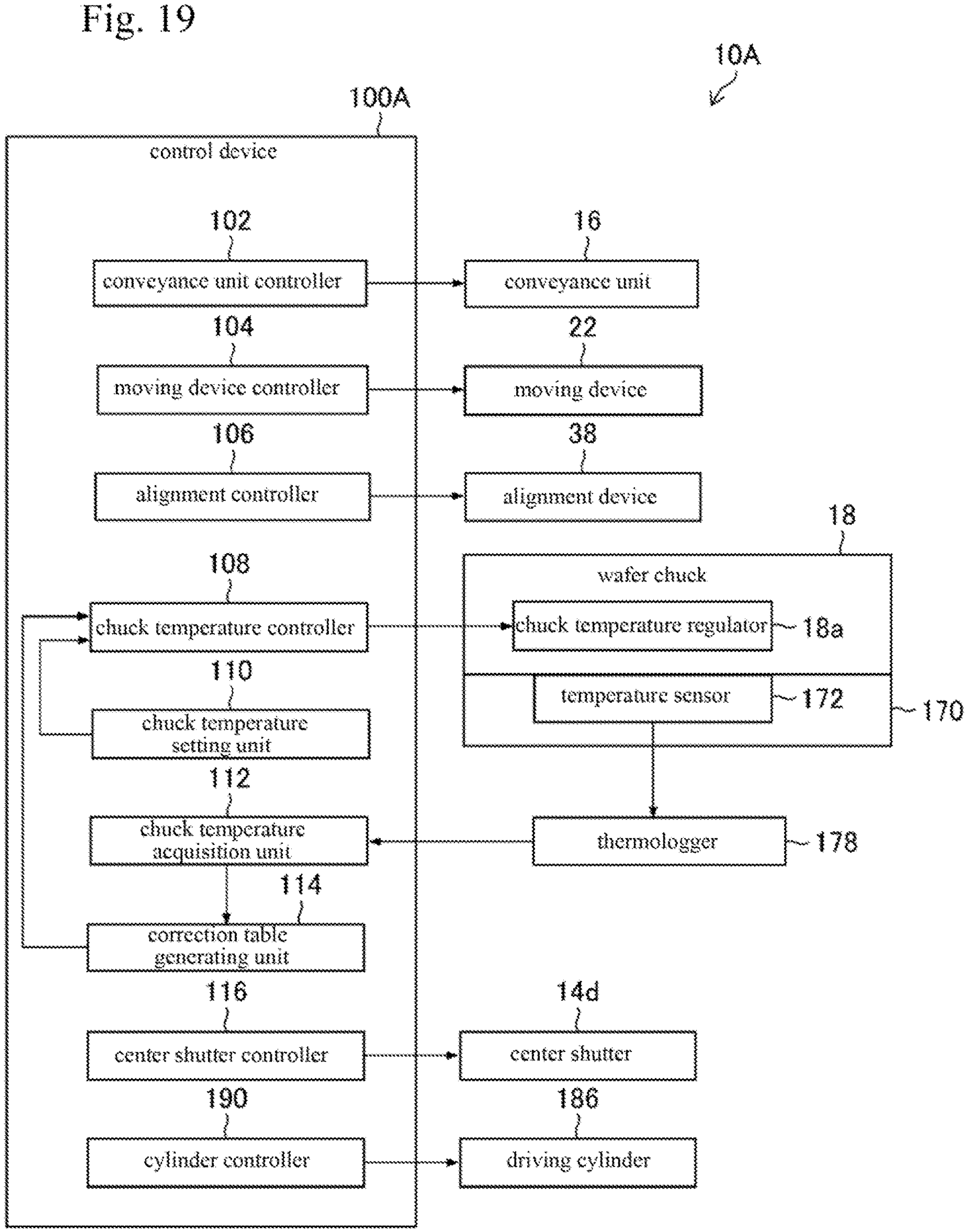
FIG. 19 is a functional block diagram showing an electrical configuration of the second embodiment of the prober.

The plurality of sensor wirings 176 transmits the sensor signals outputted from the plurality of temperature sensors 172 to a thermologger 178. The thermologger 178 transmits the measurement data of the temperature of the wafer chuck 18 measured by using the plurality of temperature sensors 172 to a prober computer 100A of a prober 10A. FIG. 15 illustrates the state that the thermologger 178 is arranged outside the measurement chamber 14. The prober 10A and the prober computer 100A of the second embodiment are shown in FIG. 19.

The temperature measurement jig 170 is attached to the head stage 20 in the maintenance area A2 shown in FIG. 1. Namely, the operator pulls out the head stage 20 from the measurement chamber 14 to the maintenance area A2, detaches the pogo frame 46 from the head stage 20, and the temperature measurement jig 170 is attached to the head stage 20 at the position where the pogo frame 46 is attached to the head stage 20. The head stage 20 to which the temperature measurement jig 170 is attached is returned to the measurement chamber 14.

Note that the temperature measurement jig 170 is an example of the temperature measurement jig which can be attached to the head stage at a position where the probe card is attached when the electric test is performed. The plurality of temperature sensors 172 described in the embodiment is an example of one or more temperature sensors. The position of the measurement chamber 14 to which the head stage 20 is returned in a state that the temperature measurement jig 170 is attached is an example of the temperature measurement position. The maintenance area A2 to which the head stage 20 is pulled out is an example of the maintenance position. The sliding mechanism for moving the head stage 20 is an example of the head stage moving mechanism for moving the head stage. The installing position of the pogo frame 46 in the head stage 20 is an example of a position of the head stage where the probe card is attached to the head stage.

Figure 16:
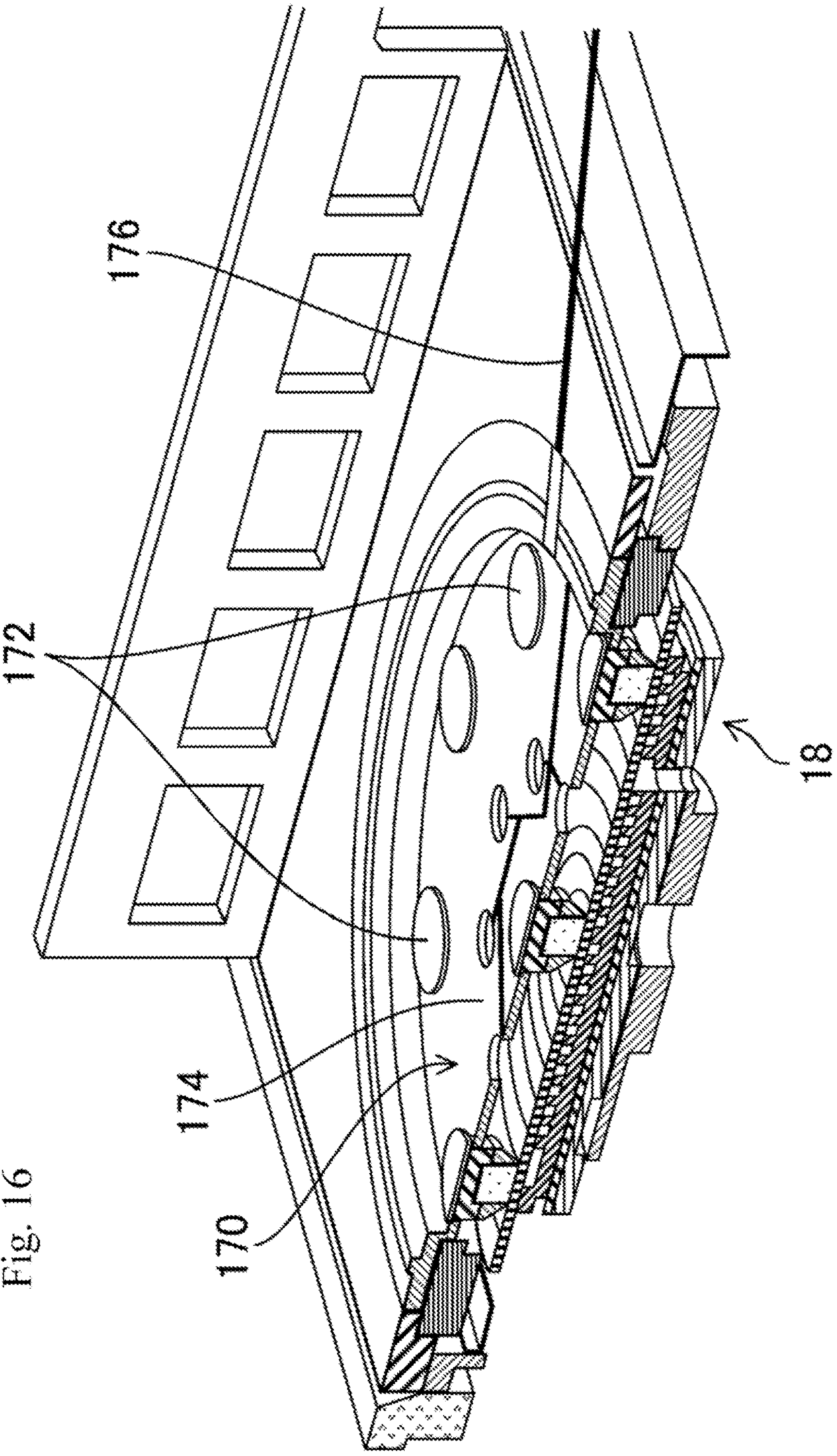
FIG. 16 is a perspective view including a partial cross-sectional view showing a configuration example of the head stage shown in FIG. 15.

FIG. 16 is a perspective view including a partial cross-sectional view showing a configuration example of the head stage shown in FIG. 15. FIG. 16 shows a state that the temperature of the wafer chuck 18 is measured by using the temperature measurement jig 170 attached to the head stage 20.

In the measurement chamber 14, the wafer chuck 18 is positioned (aligned) with respect to the temperature measurement jig 170 attached to the head stage 20 by using the alignment device and the upper surface of the wafer chuck 18 is brought into surface contact with each of the plurality of temperature sensors 172 provided on the temperature measurement jig 170. The position of the wafer chuck 18 for performing the electric test of the wafer W using the test head 44 can be applied to the position of the wafer chuck 18 which is in surface contact with each of the plurality of temperature sensors 172.

The head stage 20 includes a chuck fixing device for fixing the wafer chuck 18 to the temperature measurement jig 170 which is attached to the head stage 20. Note that the illustration of the chuck fixing device is omitted in FIG. 16.

The wafer chuck 18 is separated from the alignment device 38 and fixed to the temperature measurement jig 170 which is attached to the head stage 20 using the chuck fixing device. In the state that the wafer chuck 18 is fixed to the temperature measurement jig 170, the temperature measurement is started.

When the temperature measurement data of the wafer chuck 18 is acquired, the alignment device 38 is moved to the position for supporting the wafer chuck 18 and the fixture of the wafer chuck 18 to the temperature measurement jig 170 is released.

Configuration Example of Chuck Fixing Device

Figure 17:
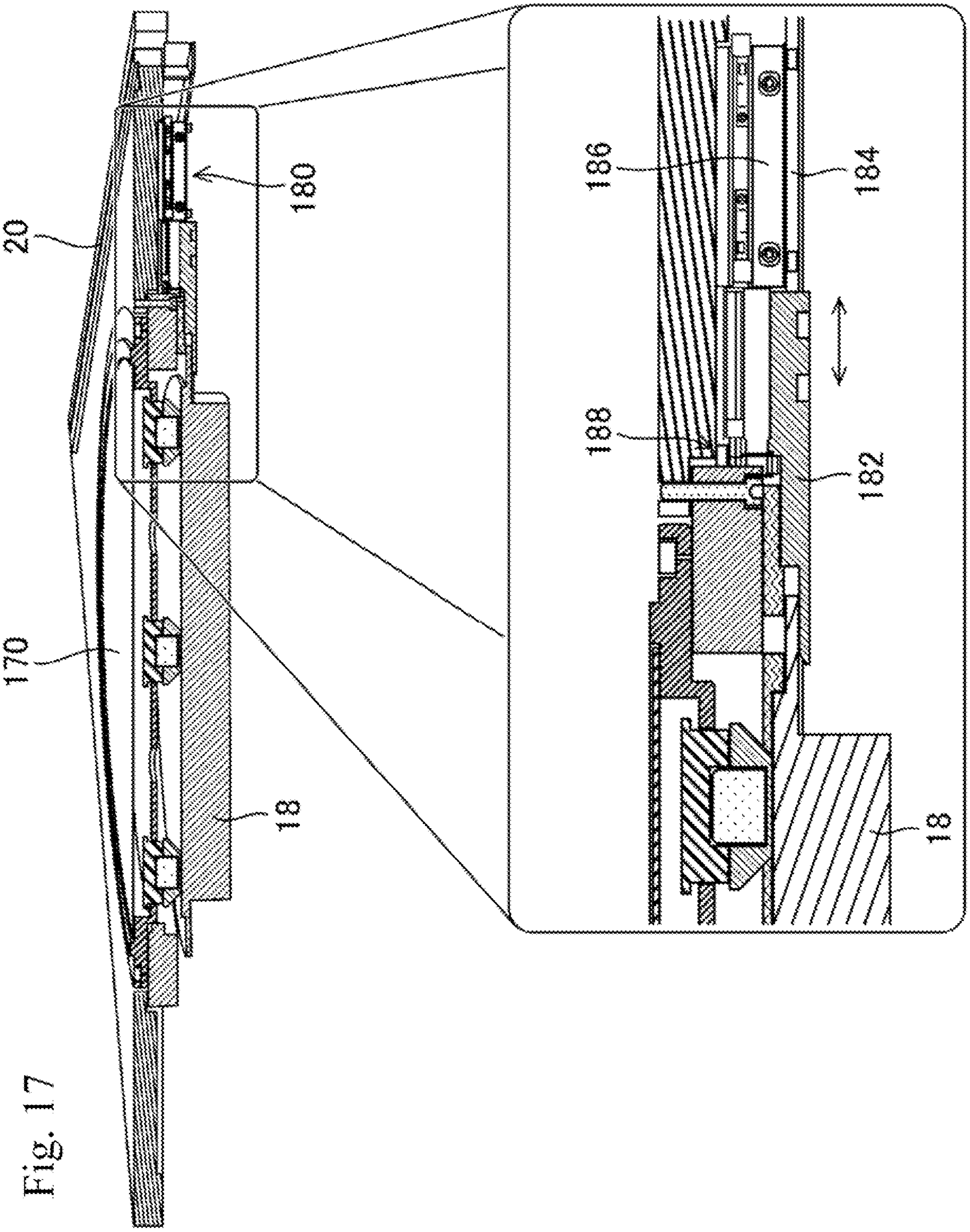
FIG. 17 is a perspective view showing a configuration example of a chuck fixing device provided on the head stage shown in FIG. 15 including a partial cross-sectional view.
Figure 18:
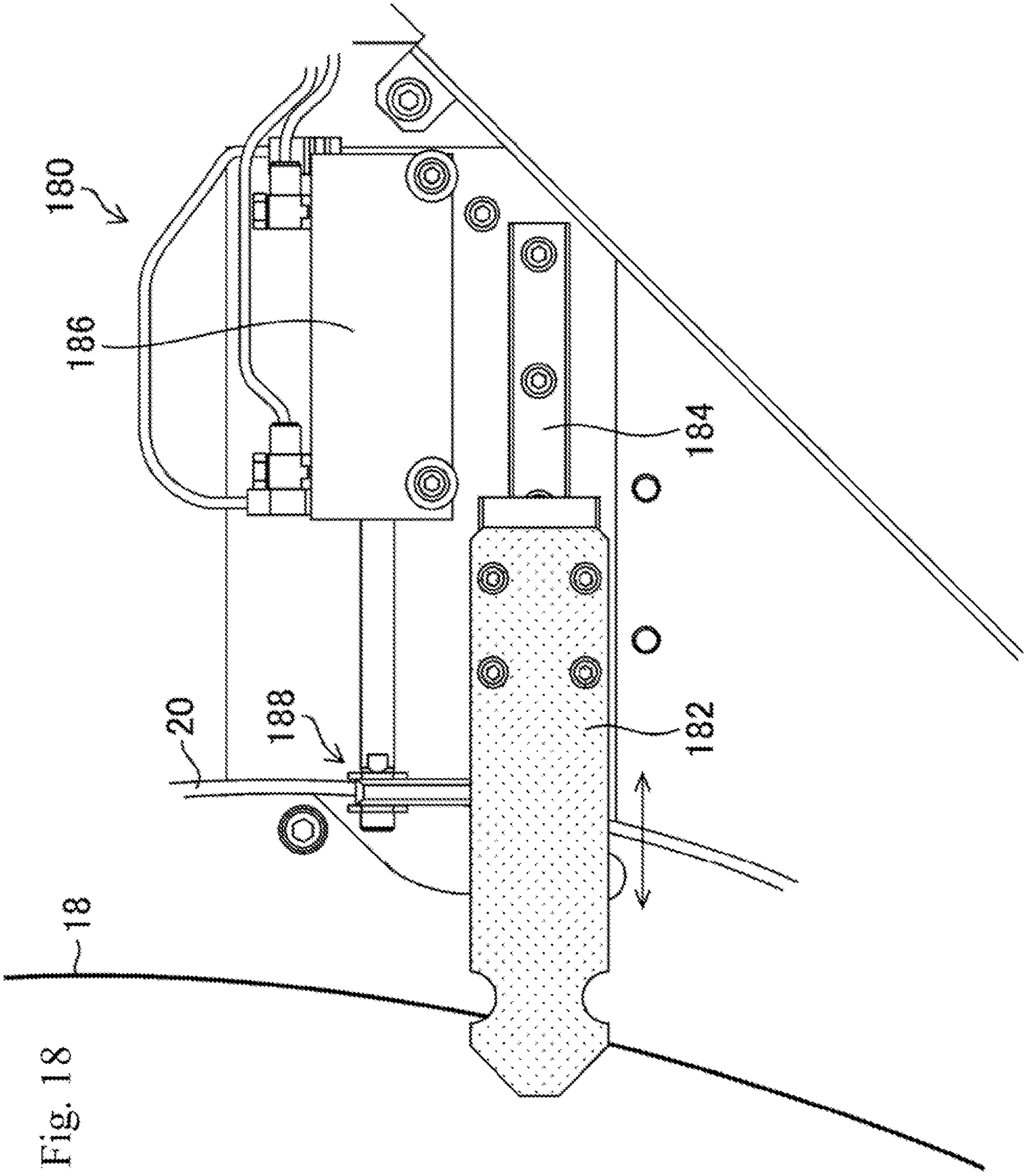
FIG. 18 is a plan view of the chuck fixing device shown in FIG. 17.

FIG. 17 is a perspective view including a partial cross-sectional view showing a configuration example of the chuck fixing device provided on the head stage shown in FIG. 15. FIG. 18 is a plan view of the chuck fixing device shown in FIG. 17.

A chuck fixing device 180 shown in FIG. 17 and FIG. 18 includes a chuck fixing member 182, a guide 184, a driving cylinder 186 and a joint portion 188.

The chuck fixing member 182 is supported so as to be movable in the directions shown in FIG. 17 and FIG. 18 by arrow lines. FIG. 17 and FIG. 18 illustrate a state that the chuck fixing member 182 fixes the wafer chuck 18 to the head stage 20.

The guide 184 supports the chuck fixing member 182 on the head stage 20 so as to be freely movable. Namely, the chuck fixing member 182 moves along the guide 184 fixed to the head stage 20.

The driving cylinder 186 is a driving source of the chuck fixing member 182. The driving cylinder 186 is fixed to the chuck fixing member 182 by using the joint portion 188.

Electrical Configuration of Second Embodiment of Prober

FIG. 19 is a functional block diagram showing an electrical configuration of the second embodiment of the prober. In a control device 100A of the prober 10A, a cylinder controller 190 for controlling the driving cylinder 186 is added compared to the control device 100 shown in FIG. 13.

In addition, the prober 10A shown in FIG. 19 is equipped with the temperature measurement jig 170, the temperature sensors 172 and the thermologger 178 instead of the temperature measurement jig 70, the temperature sensors 72 and the thermologger 78 shown in FIG. 13.

Procedures of Second Embodiment of Temperature Measurement Method

In the second embodiment of the temperature measurement method, in the flow of the temperature measurement jig attaching process S10 shown in FIG. 14, the temperature measurement jigs 170 are attached to the head stages 20 of two or more measurement chambers 14 in the plurality of measurement chambers 14 shown in FIG. 1. For example, the temperature measurement jigs 170 can be attached to the head stages 20 of all of the measurement chambers 14. In addition, the wafer chucks 18 are fixed to the temperature measurement jigs 170 in the temperature measurement jig attaching process S10.

When the temperature measurement jig 170 is attached to the head stage 20 of each of the plurality of measurement chambers 14, the prober 10A can perform the temperature measurement of the wafer chuck 18 on the plurality of measurement chambers 14 simultaneously. Therefore, in the temperature measurement method of this embodiment, the unmeasured chuck determining process S28 and the temperature measurement jig moving process S30 are omitted. After the correction setting process S24, the process is advanced to the calibration temperature determining process S32 and each process is performed same as the above described temperature measurement method (first embodiment).

Operation and Effect of Second Embodiment of Prober and Temperature Measurement Method In the second embodiment of the prober and the temperature measurement method, the similar operation and effect as the first embodiment can be obtained. In addition, since the temperature measurement jig 170 is attached to the head stage 20 from which the pogo frame 46 is detached in the second embodiment, the pogo frame for exclusive use described in Patent document 1 is not required.

Concrete Example of Temperature Sensor

Figure 20A:
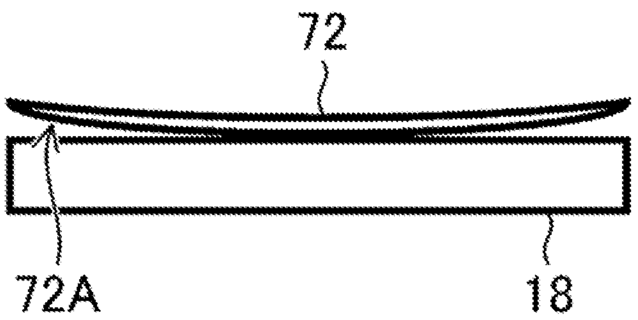
FIG. 20A is a schematic diagram showing a concrete example of a temperature sensor.

FIG. 20A is a schematic diagram showing a concrete example of the temperature sensor. The temperature sensor 72 includes a contactor 72A. The contactor 72A is in surface contact with the upper surface of the wafer chuck 18. The upper surface is the surface of the wafer chuck 18 to be measured. FIG. 20A is a schematic enlarged view.

A rectangular shape is applied to the shape of the surface of the contactor 72A to be contacted with the wafer chuck 18, for example. The temperature sensor 172 shown in FIG. 15 or the like is also equipped with a contactor with which the upper surface of the wafer chuck 18 is in surface contact.

Figure 20B:
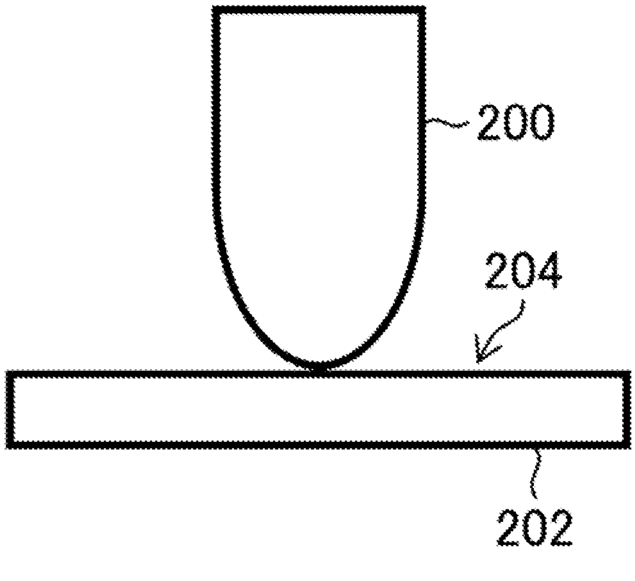
FIG. 20B is a schematic diagram showing another example of the temperature sensor.

FIG. 20B is a schematic diagram showing another example of the temperature sensor. A temperature sensor 200 is point-contacted with the surface to be measured of a measuring object 202. In the temperature sensors 72 using the surface contact (including the temperature sensor using a surface-contact contactor having different shape), more excellent robustness can be ensured against external disturbance such as an airflow compared to the temperature sensor 200 using the point contact.

Modified Example of Prober

The first embodiment and the second embodiment of the prober include the plurality of measurement chambers 14. However, the above described configuration is merely example. The first embodiment and the second embodiment of the temperature measurement method can be applied to the prober having only one measurement chamber.

In the above described embodiments, the components can be arbitrarily changed, added and deleted within a range not deviating from the purpose. Other than the above described embodiments, a lot of modifications are possible by a person with ordinary knowledge in the art within technical ideas shown in the present disclosure. In addition, the embodiments, the modified examples and the application examples can be arbitrarily combined with each other.

DESCRIPTION OF THE REFERENCE NUMERALS

1: temperature measurement jig, 2: frame, 3: guide rail, 4: temperature sensor, 5: measurement terminal, 10: prober, 10A: prober, 12: conveyed article housing portion, 12*a*: wafer housing portion, 12*b*: probe card housing portion, 14: measurement chamber, 14*a*: first opening, 14*b*: second opening, 16: conveyance unit, 16*a*: housing, 16*b*: wafer holding arm, 16*c*: probe card holding arm, 18: wafer chuck, 18*a*: chuck temperature regulator, 20: head stage, 22: moving device, 28: rotation mechanism, 40: second probe card supporting mechanism, 36: first probe card supporting mechanism, 40*a*: support portion, 44: test head, 46: pogo frame, 48: test head elevating mechanism, 50: test head sliding mechanism, 54: head stage sliding mechanism, 56: base, 58: test head guide rail, 62: base, 64: head stage guide rail, 70: temperature measurement jig, 72: temperature sensor, 72A: contactor, 73: seal member, 74: main body, 75: vacuum pump, 76: sensor wiring, 78: thermologger, 100: control device, 100A: control device, 102: conveyance unit controller, 104: moving device controller, 106: alignment controller, 108: chuck temperature controller, 110: chuck temperature setting unit, 112: chuck temperature acquisition unit, 114: correction table generating unit, 116: center shutter controller, 170: temperature measurement jig, 172: temperature sensor, 174: main body, 176: sensor wiring, 178: thermologger, 180: chuck fixing device, 182: chuck fixing member, 184: guide, 186: driving cylinder, 188: joint portion, 200: temperature sensor, 202: measuring object, A1: conveyance area, A2: maintenance area, PC: probe card, W: wafer, WC: wafer chuck

The invention claimed is:

1. A prober for performing an electric test of a wafer, the prober comprising:

a wafer chuck configured to support the wafer;

a conveyance device configured to transfer a probe card to the wafer chuck; and a conveyance controller configured to control an operation of the conveyance device, wherein the conveyance device is configured to support a temperature measurement jig when a temperature measurement of the wafer chuck is performed, the temperature measurement jig being able to be supported at a position where the probe card is supported when the probe card is conveyed, the temperature measurement jig having one or more temperature sensors, the conveyance controller performs an operation control of the conveyance device for aligning the one or more temperature sensors with a surface of the wafer chuck to be measured in a state that the conveyance device supports the temperature measurement jig, and the temperature measurement of the wafer chuck is performed by the one or more temperature sensors in a state that the conveyance device supports the temperature measurement jig.

2. The prober according to claim 1, wherein a measured data collecting device for collecting a temperature measurement data of the wafer chuck transmitted from the one or more temperature sensors is configured to be attached to the conveyance device.

3. The prober according to claim 2, wherein the conveyance device is configured to support the temperature measurement jig by a tip of an arm extending outward from a main body, the measured data collecting device is configured to be electrically connected with each of the one or more temperature sensors using an electric wiring, and the electric wiring is configured to be supported by using the arm.

4. The prober according to claim 1, wherein the one or more temperature sensors include a contactor with which the surface of the wafer chuck to be measured is in surface contact.

5. A temperature measurement method for measuring a temperature of a wafer chuck which is configured to support a wafer in a prober for performing an electric test of the wafer, the method comprising the steps of:

conveying a temperature measurement jig using a conveyance device configured to transfer a probe card to the wafer chuck, the temperature measurement jig being able to be supported at a position where the probe card is supported when the probe card is conveyed, the temperature measurement jig having one or more temperature sensors; and performing an operation control of the conveyance device for aligning the one or more temperature sensors with a surface of the wafer chuck to be measured in a state that the conveyance device supports the temperature measurement jig, wherein the temperature measurement of the wafer chuck is performed by the one or more temperature sensors in a state that the conveyance device supports the temperature measurement jig.

6. The temperature measurement method according to claim 5, wherein a temperature measurement data of the wafer chuck transmitted from the one or more temperature sensors is collected.

* * * * *